(12) United States Patent
Kakkad

(10) Patent No.: US 11,791,159 B2
(45) Date of Patent: Oct. 17, 2023

(54) METHOD OF FABRICATING THIN, CRYSTALLINE SILICON FILM AND THIN FILM TRANSISTORS

(71) Applicant: Ramesh kumar Harjivan Kakkad, Gujarat (IN)

(72) Inventor: Ramesh kumar Harjivan Kakkad, Gujarat (IN)

(*) Notice: Subject to any disclaimer, the term of this patent is extended or adjusted under 35 U.S.C. 154(b) by 461 days.

(21) Appl. No.: 16/938,851

(22) Filed: Jul. 24, 2020

(65) Prior Publication Data

US 2020/0357638 A1 Nov. 12, 2020

Related U.S. Application Data

(63) Continuation-in-part of application No. 16/745,912, filed on Jan. 17, 2020, now Pat. No. 11,562,903.

(Continued)

(51) Int. Cl.
*H01L 21/02* (2006.01)
*H01L 29/786* (2006.01)
(Continued)

(52) U.S. Cl.
CPC .... *H01L 21/02667* (2013.01); *H01L 21/0245* (2013.01); *H01L 21/02532* (2013.01);
(Continued)

(58) Field of Classification Search
None
See application file for complete search history.

(56) References Cited

U.S. PATENT DOCUMENTS 4,392,011 A 7/1983 Pankove et al.
5,147,826 A 9/1992 Liu
(Continued)

OTHER PUBLICATIONS

Kagan, Cherie R. and Andry, Paul. "Thin-Film Transistors" Marcel Dekker, Inc. 2003, p. 53.
(Continued)

*Primary Examiner* — Scott B Geyer
(74) *Attorney, Agent, or Firm* — Brown & Michaels, PC

(57) ABSTRACT

A method of producing a crystalline silicon film includes forming a first silicon film that is amorphous at formation, forming a doped film of silicon or germanium on the first silicon film, the doped film being amorphous at formation; and annealing the structure to crystallize the doped film and the first silicon film. A method of producing a crystalline silicon film includes forming a $Si_{x1}Ge_{1-x1}$ film on a substrate, forming a $Si_{x2}Ge_{1-x2}$ film on the $Si_{x1}Ge_{1-x1}$ film, the $Si_{x1}Ge_{1-x1}$ film being amorphous at formation and having a first thermal budget for crystallization, the $Si_{x2}Ge_{1-x2}$ film being amorphous at formation and having a second thermal budget for crystallization, the second thermal budget being lower than the first thermal budget, forming a silicon film on the $Si_{x2}Ge_{1-x2}$ film, the silicon film being amorphous at formation; and annealing to crystallize the $Si_{x1}Ge_{1-x1}$ film, the $Si_{x2}Ge_{1-x2}$ film, and the silicon film.

13 Claims, 16 Drawing Sheets

Related U.S. Application Data

(60) Provisional application No. 62/963,439, filed on Jan. 20, 2020, provisional application No. 62/944,446, filed on Dec. 6, 2019, provisional application No. 62/793,437, filed on Jan. 17, 2019.

(51) Int. Cl.
   *H01L 29/66* (2006.01)
   *H01L 29/167* (2006.01)

(52) U.S. Cl.
   CPC .. *H01L 21/02573* (2013.01); *H01L 21/02592* (2013.01); *H01L 21/02672* (2013.01); *H01L 29/167* (2013.01); *H01L 29/66757* (2013.01); *H01L 29/78675* (2013.01); *H01L 21/02496* (2013.01)

(56) References Cited

U.S. PATENT DOCUMENTS

| | | | |
|---|---|---|---|
| 5,242,507 A | 9/1993 | Iverson | |
| 5,498,904 A | 3/1996 | Harata et al. | |
| 5,733,804 A | 3/1998 | Hack | |
| 5,797,999 A | 8/1998 | Sannomiya et al. | |
| 5,830,784 A | 11/1998 | Zhang et al. | |
| 6,090,646 A | 7/2000 | Zhang et al. | |
| 6,162,711 A | 12/2000 | Ma | |
| 6,309,951 B1 | 10/2001 | Jang et al. | |
| 6,326,226 B1 | 12/2001 | Jang et al. | |
| 6,355,544 B1 | 3/2002 | Essaian | |
| 6,455,871 B1* | 9/2002 | Shim | H01L 29/66431 257/190 |
| 6,747,254 B2 | 6/2004 | Kim | |
| 6,878,610 B1 | 4/2005 | Lin et al. | |
| 6,894,337 B1 | 5/2005 | Wang et al. | |
| 7,078,325 B2* | 7/2006 | Curello | H01L 29/365 257/E21.537 |
| 7,119,382 B2* | 10/2006 | Sato | H01L 29/1004 257/199 |
| 7,423,322 B2 | 9/2008 | Seo et al. | |
| 10,840,094 B2* | 11/2020 | Maeda | H01L 21/02595 |
| 11,101,368 B2 | 8/2021 | Qu et al. | |
| 2002/0011264 A1 | 1/2002 | Saito | |
| 2002/0076871 A1* | 6/2002 | Yanagawa | H01L 21/268 257/E21.349 |
| 2002/0168868 A1 | 11/2002 | Todd | |
| 2003/0030052 A1 | 2/2003 | Oka et al. | |
| 2003/0077867 A1* | 4/2003 | Fitzgerald | H01L 29/66916 438/455 |
| 2004/0048450 A1* | 3/2004 | Tweet | H01L 21/0245 257/E21.12 |
| 2004/0161947 A1* | 8/2004 | Fitzgerald | H01L 21/02505 257/E21.445 |
| 2005/0070076 A1* | 3/2005 | Dion | H01L 21/02532 438/478 |
| 2005/0151209 A1* | 7/2005 | Yamamoto | H01L 21/2807 257/407 |
| 2005/0170617 A1* | 8/2005 | Kurokawa | H01L 29/4966 438/483 |
| 2005/0186723 A1 | 8/2005 | Kim | |
| 2005/0186750 A1* | 8/2005 | Lee | H01L 29/66242 438/318 |
| 2006/0046504 A1 | 3/2006 | Kayama et al. | |
| 2006/0102888 A1* | 5/2006 | Cho | H01L 21/26506 257/19 |
| 2006/0286780 A1 | 12/2006 | Jin Jang et al. | |
| 2007/0004109 A1 | 1/2007 | Ichijo et al. | |
| 2007/0004185 A1* | 1/2007 | Kakkad | H01L 21/02573 257/E21.414 |
| 2008/0206967 A1 | 8/2008 | Miyairi et al. | |
| 2010/0227443 A1 | 9/2010 | Lee et al. | |
| 2010/0255662 A1* | 10/2010 | Witvrouw | C23C 16/50 438/479 |
| 2011/0084308 A1* | 4/2011 | Loh | H01L 21/02381 257/190 |
| 2011/0088760 A1 | 4/2011 | Sheng et al. | |
| 2012/0025200 A1 | 2/2012 | Aoyama et al. | |
| 2012/0056187 A1 | 3/2012 | Park et al. | |
| 2012/0204941 A1 | 8/2012 | Cargo et al. | |
| 2013/0023110 A1* | 1/2013 | Kakimoto | H01L 21/0245 118/725 |
| 2013/0244399 A1 | 9/2013 | Okada | |
| 2014/0138695 A1 | 5/2014 | Tian et al. | |
| 2015/0228501 A1* | 8/2015 | Bedell | H01L 21/02513 438/151 |
| 2016/0020095 A1 | 1/2016 | Kwok et al. | |
| 2016/0189961 A1 | 6/2016 | Tang | |
| 2017/0125626 A1 | 5/2017 | Nunan et al. | |
| 2017/0170013 A1* | 6/2017 | Zhang | H01L 21/0245 |
| 2017/0178950 A1 | 6/2017 | Batude et al. | |
| 2018/0166603 A1 | 6/2018 | Kakkad | |
| 2018/0182865 A1 | 6/2018 | Hao et al. | |
| 2019/0131124 A1* | 5/2019 | Kohen | H10B 43/27 |
| 2019/0206679 A1* | 7/2019 | Maeda | H01L 21/02595 |

OTHER PUBLICATIONS

Wolford, D.J. et al. "Efficient Visible Photoluminescence in the Binary a-SiHx Alloy System". Appl. Phys Lett. 42 (4). p. 369-371. 1983.

Kakkad, R. et al. "Low Temperature Selective Crystallization of Amorphous Silicon." Journal of Non-Crystalline Solids 115. p. 66-68. 1989.

Miyasaka, Mitsutoshi. "In situ Observation of Nickel Metal-Induced Lateral Crystallization of Amorphous Silicon Thin Films." Applied Physics Letters, vol. 80. No. 6. pp. 944-946. 2002.

Kim, Hyoung-June & Shin, Dong Hoon. "Development of Rapid Thermal Processor for Large Glass LTPS Production." IMID/IDMC '06 Digest, p. 533-536. 2006.

\* cited by examiner

METHOD OF FABRICATING THIN, CRYSTALLINE SILICON FILM AND THIN FILM TRANSISTORS

This application claims an invention disclosed in U.S. Provisional Application 62/963,439, filed on Jan. 20, 2020, entitled "Method of Fabricating Thin Film Crystalline Silicon and Thin Film Transistors", and in U.S. patent application Ser. No. 16/745,912, filed Jan. 17, 2020, entitled "Method of Fabricating Thin, Crystalline Silicon Film and Thin Film Transistors", which claims the benefit under 35 USC § 119(e) of U.S. Provisional Application No. 62/793,437, filed on Jan. 17, 2019, entitled "Method of Fabricating Thin Film Crystalline Silicon and Thin Film Transistors", and U.S. Provisional Application No. 62/944,446, filed on Dec. 6, 2019 in the USPTO, entitled "Method of Fabricating Thin Film Crystalline Silicon and Thin Film Transistors". The benefit under 35 USC § 120 of U.S. patent application Ser. No. 16/745,912, and the benefit under 35 USC § 119(e) of U.S. Provisional Application 62/963,439 is hereby claimed. The aforementioned applications are hereby incorporated herein by reference.

BACKGROUND OF THE INVENTION

Field of Disclosure

The present invention relates to a method of fabricating polysilicon film as well as devices incorporating such polysilicon film.

Description of the Related Art

Polycrystalline silicon (polysilicon or poly Si) thin film transistors (TFT) are used in AMOLED displays as well as high-resolution LCD display applications. In the poly Si TFTs, a polycrystalline silicon layer is used as an active layer of the devices. Currently, in the industry, the polycrystalline silicon active layer of TFTs is fabricated by excimer laser annealing (ELA) of amorphous silicon (a-Si) thin film deposited on a large-area substrate such as glass. In an ELA process, a long, narrow laser beam is scanned over an amorphous silicon film to raise its temperature to crystallize it by a "melt and regrowth" process. The resulting crystalline silicon is called polycrystalline silicon (as it contains silicon crystals with several crystallographic orientations). Even though the ELA process is widely used to fabricate polycrystalline silicon films for TFT devices, there are certain issues associated with the ELA approach. The ELA process is very expensive to operate and maintain. Secondly, when AMOLED displays are fabricated using TFTs incorporating ELA poly Si films, defects occur on the displayed images called "ELA scan mura". These "scan mura" appear as a result of laser scanning during the crystallization process. A difference in crystalline quality of silicon at boundaries between successive laser scans leads to different TFT characteristics at the scan boundaries, resulting in the appearance of scan lines on the displayed images. In order to reduce the appearance of scan-mura, complicated pixel circuits are used employing multiple TFTs and capacitors (such as 7 TFTs and 2 capacitors) at each sub-pixel of display to compensate for the difference in TFT characteristics. These additional devices crowd the pixel areas and thus limit the display resolution. Also, the additional devices affect the device yield, since the probability of defects occurring in the display increases with an increase in the number of devices.

Solid phase crystallization (SPC) is a simpler, inexpensive method to crystallize amorphous silicon films formed on large area substrate. In SPC silicon film is not melted during the crystallization. In conventional SPC, an amorphous silicon film deposited on a substrate is thermally heated (for example, in a furnace) at around 700 degrees Celsius for several minutes to cause crystallization of the silicon film. In this method, the entire film is crystallized simultaneously and there is no scanning Thus there are no scan-mura on the displayed images, and the simplest of pixel circuits (two transistors and one capacitor) can be used at each sub-pixel of AMOLED displays. This SPC would allow for higher resolution displays and would improve production yield. Although the SPC method is simple and inexpensive, and the image uniformity is better (no scan-mura), the performance of TFTs fabricated using SPC poly Si films is not adequate in terms of TFT sub-threshold swing and threshold voltages required for display applications. There are many intra-grain defects (defects within a crystal) and grain boundary defects (defects between adjacent crystals due to difference in crystal orientation) in SPC poly Si films, and these defects trap charge carriers and thus limit the TFT device performance. Even though both grain-boundary defects and intra-grain defect are found in thermally annealed (SPC) polysilicon films, the intra-grain defects seem to dominate the overall defect concentration. The presence of intra-grain defects is known to reduce an effective defect-free area down to 30 nm even though polysilicon grain size as determined by locations of grain-boundaries is in the range of 500 nm to 1 micrometer for an a-Si film crystallized in the practical temperature range of 600-700° C.

Thus, reducing crystalline defects, especially intra-grain defects, can be important to improve the performance of TFT devices using poly crystalline silicon films formed using SPC.

SUMMARY OF THE INVENTION

Methods are provided to form a crystalline silicon (polysilicon) thin film on a foreign substrate with an improved (reduced) crystalline defect density. In the methods, nucleation and crystal growth of precursor film starts from a surface/interface located away from the substrate surface during the solid phase crystallization process. Further methods are provided to form TFT devices incorporating the reduced-defect density polysilicon film.

In some embodiments, a method of producing a reduced-defect density crystalline silicon film includes: forming a first intrinsic silicon film on a substrate, the first intrinsic silicon film being amorphous at formation; forming a doped silicon film on the first intrinsic silicon film, the doped silicon film being amorphous at formation, the doped silicon film being spaced apart from the substrate by the first intrinsic silicon film; forming a second intrinsic silicon film on the doped silicon film, the second intrinsic silicon film being amorphous at formation; and annealing to cause crystallization of the doped silicon film, the second intrinsic silicon film, and the first intrinsic silicon film, such that the crystallization is initiated within the doped silicon film and propagates through the first intrinsic silicon film and the second intrinsic silicon film, transforming the second intrinsic silicon film to a reduced-density crystallized intrinsic silicon film.

In some embodiments, a method of producing a reduced-defect density crystalline silicon film includes: forming a first silicon film on a substrate, the first silicon film being amorphous at formation; forming a $Si_xGe_{1-x}$ film on the first silicon film, x having a value between zero and one including zero, the $Si_xGe_{1-x}$ film being amorphous at formation, the $Si_xGe_{1-x}$ film being spaced apart from the substrate by the first silicon film; forming a second silicon film on the $Si_xGe_{1-x}$ film, the second silicon film being intrinsic, the second silicon film being amorphous at formation; and annealing to cause crystallization of the $Si_xGe_{1-x}$ film, the second silicon film, and the first silicon film, such that the crystallization is initiated within the $Si_xGe_{1-x}$ film and propagates through the first silicon film and the second silicon film, transforming the second silicon film to a reduced-density, intrinsic, crystallized, second silicon film.

In some embodiments, a method of forming a thin film transistor includes: forming a first intrinsic silicon layer on a substrate, the first intrinsic silicon layer being amorphous initially; forming a doped silicon layer on the first intrinsic silicon layer, the doped silicon layer being amorphous initially, the doped silicon layer being spaced apart from the substrate by the first intrinsic silicon layer; forming a second intrinsic silicon layer on the doped silicon layer, the second intrinsic silicon layer being amorphous initially; and annealing to cause crystallization of the doped silicon layer, the second intrinsic silicon layer, and the first intrinsic silicon layer such that the crystallization initiates within the doped silicon layer and propagates through the first intrinsic silicon layer and the second intrinsic silicon layer; forming an active layer of TFT in the second intrinsic silicon layer by doping the second intrinsic silicon layer in selected areas to form source and drain regions separated by a channel portion, a conductivity type of the source and drain being opposite a conductivity type of the doped silicon layer; forming a gate insulator layer on the crystallized second intrinsic silicon layer; and forming a gate electrode pattern over the gate insulator layer.

In some embodiments, a method of forming thin film transistor includes: forming a first silicon layer on a substrate, the first silicon layer being amorphous at formation; forming a $Si_xGe_{1-x}$ layer on the first silicon layer, x having a value between zero and one including zero, the $Si_xGe_{1-x}$ layer being amorphous at formation, the $Si_xGe_{1-x}$ layer being spaced apart from the substrate by the first silicon layer; forming a second silicon layer on the $Si_xGe_{1-x}$ layer, the second silicon layer being amorphous at formation, the second silicon layer including intrinsic silicon; annealing to cause crystallization of the $Si_xGe_{1-x}$ layer, the second silicon layer, and the first silicon layer, such that the crystallization is initiated within the $Si_xGe_{1-x}$ layer and propagates through the first silicon layer and the second silicon layer; doping the second silicon layer in selected areas to form source and drain regions separated by a channel portion; forming a gate insulator layer on the second silicon layer; and forming a gate electrode pattern over the gate insulator layer.

In some embodiments, a method of producing a polycrystalline silicon thin film transistor includes: forming nickel patterns on a substrate; forming a phosphorus doped silicon layer over the substrate and the nickel patterns, the phosphorus doped silicon layer being amorphous at formation; forming an intrinsic silicon layer on the phosphorus doped silicon layer, the intrinsic silicon layer being amorphous at formation; annealing the phosphorus doped silicon layer, the intrinsic silicon layer, and the nickel patterns to cause crystallization of the phosphorus doped silicon layer, and the intrinsic silicon, wherein the crystallization propagates by a combination of lateral crystal growth between the nickel patterns and vertical crystal growth to crystallize the phosphorus doped silicon layer, and the intrinsic silicon layer; forming a gate insulator layer over the intrinsic silicon layer; forming a gate electrode pattern over the gate insulator layer; and doping into the selected areas of the intrinsic silicon layer to form source and drain regions separated by a channel region.

In some embodiments, a method of forming a crystalline silicon layer of a TFT device having a gate, a gate insulator, and an active layer, the active layer comprising source, drain, and channel regions formed in the crystalline silicon layer, includes: forming a first silicon film, the first silicon film being amorphous at formation; forming a phosphorus doped silicon film on the first silicon film, the phosphorous doped silicon film being amorphous at formation; forming a nickel film on the phosphorus doped silicon film; and annealing the structure to crystallize the phosphorus doped silicon film and the first silicon film, wherein crystallization propagates by a combination of lateral crystal growth and vertical crystal growth.

In some embodiments, a method of forming polycrystalline silicon TFT includes: forming a first intrinsic silicon film on a substrate, the first intrinsic silicon film being amorphous initially; forming a phosphorus doped silicon film on the first intrinsic silicon film, the phosphorous doped silicon film being amorphous initially; forming nickel patterns on the phosphorus doped silicon film; annealing the structure to cause crystallization of the phosphorus doped silicon film and the first intrinsic silicon film, wherein the crystallization propagates by a combination of lateral crystal growth between the nickel patterns and vertical crystal growth; removing the phosphorus doped silicon film from the first intrinsic silicon film after the crystallization; forming a gate insulator film over the crystallized first intrinsic silicon film; forming a gate electrode pattern over the gate insulator film; and doping into the selected areas of the crystallized first intrinsic silicon film to form source and drain regions separated by a channel region.

In some embodiments, a TFT device includes: a substrate; a crystallized first silicon layer arranged on the substrate; a crystallized doped silicon layer arranged on the first silicon layer, the doped silicon layer having a doping concentration $10^{20}$ $cm^{-3}$ or higher, the crystallized doped silicon layer being spaced apart from the substrate by the crystallized first silicon layer; a crystallized active silicon layer arranged on the doped layer, the crystallized active silicon layer having source and drain regions, and a channel region, the source and drain regions disposed on either side of the channel region, a conductivity type of the source and drain region being opposite a conductivity type of the crystallized doped silicon layer; a gate insulator layer arranged on the crystallized active silicon layer; and a gate electrode pattern arranged on the gate insulator layer.

In some embodiments, a method of producing a reduced-defect density crystalline silicon film includes: forming a $Si_{x1}Ge_{1-x1}$ film on a substrate, where x1 has a value between zero and one including zero, the $Si_{x1}Ge_{1-x1}$ film being amorphous at formation and having a first thermal budget for crystallization; forming a $Si_{x2}Ge_{1-x2}$ film on the $Si_{x1}Ge_{1-x1}$ film, x2 having a value between zero and one including zero, the $Si_{x2}Ge_{1-x2}$ film being amorphous at formation and having a second thermal budget for crystallization, the second thermal budget being lower than the first thermal budget, the $Si_{x2}Ge_{1-x2}$ film being spaced apart from the substrate by the $Si_{x1}Ge_{1-x1}$ film; forming a silicon film on the $Si_{x2}Ge_{1-x2}$ film, the silicon film being amorphous at formation; and annealing to crystallize the $Si_{x1}Ge_{1-x1}$ film, the $Si_{x2}Ge_{1-x2}$ film, and the silicon film, such that crystallization is initiated within the $Si_{x2}Ge_{1-x2}$ film and propagates through the silicon film and the $Si_{x1}Ge_{1-x1}$ film, transforming the silicon film to a reduced-density, crystallized silicon film.

In some embodiments, a crystalline silicon TFT device includes: substrate; a $Si_{x1}Ge_{1-x1}$ layer on the substrate, where x1 has a value between zero and one including zero, the $Si_{x1}Ge_{1-x1}$ layer having a first crystallization thermal budget; a $Si_{x2}Ge_{1-x2}$ layer arranged on the $Si_{x1}Ge_{1-x1}$ layer, where x2 has a value between zero and one including zero, the $Si_{x2}Ge_{1-x2}$ layer having a second crystallization thermal budget, the second crystallization thermal budget being lower than the first crystallization thermal budget, the $Si_{x2}Ge_{1-x2}$ layer being spaced apart from the substrate by the $Si_{x1}Ge_{1-x1}$ layer; and a silicon layer on the $Si_{x2}Ge_{1-x2}$ layer.

In some embodiments, a crystalline silicon TFT device includes: a substrate; a crystallized $Si_{x1}Ge_{1-x1}$ layer on the substrate, the crystallized $Si_{x1}Ge_{1-x1}$ layer formed by crystallizing a first $Si_{x1}Ge_{1-x1}$ layer, x1 having a value between zero and one including zero, the first $Si_{x1}Ge_{1-x1}$ layer having a first crystallization thermal budget; a crystallized $Si_{x2}Ge_{1-x2}$ layer on the crystallized $Si_{x1}Ge_{1-x1}$ layer, the crystallized $Si_{x2}Ge_{1-x2}$ layer formed by crystallizing a first $Si_{x2}Ge_{1-x2}$ layer, x2 having a value between zero and one including zero, the first $Si_{x2}Ge_{1-x2}$ layer having a second crystallization thermal budget, the second crystallization thermal budget being lower than the first crystallization thermal budget, the crystallized $Si_{x2}Ge_{1-x2}$ layer being spaced apart from the substrate by the crystallized $Si_{x1}Ge_{1-x1}$ layer; a crystallized silicon layer on the $Si_{x2}Ge_{1-x2}$ layer, the crystallized silicon layer having source and drain regions, and a channel region, the source and drain regions disposed on either side of the channel region; a gate insulator layer on the crystallized silicon layer; and a gate electrode on the gate insulator layer.

DETAILED DESCRIPTION OF THE INVENTION

Figure 1:
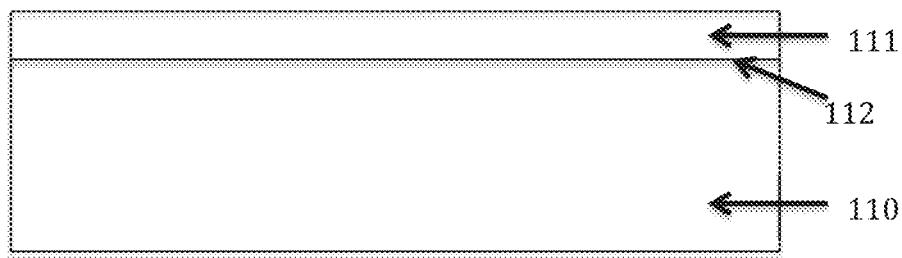
FIG. 1 is a schematic diagram showing a conventional technique of forming a polycrystalline silicon film.

FIG. 1 illustrates a conventional method of crystallizing amorphous silicon (i.e. a-Si) arranged on a foreign substrate such as glass by solid phase crystallization (SPC). In the figure, a substrate 110 such as glass generally includes a coating of a $SiO_2$ layer or a dual-layer $SiN/SiO_2$ to reduce contamination from glass. These coatings are regarded as part of the substrate. An intrinsic Si film 111 or layer, initially amorphous, generally 500-2000 Å thick, is formed on the substrate 110 by plasma enhanced chemical vapor deposition (PECVD). The terms "film" and "layer" are used herein interchangeably. The Si film 111 is annealed at an elevated temperature to crystallize it by solid phase crystallization (SPC). Generally, a temperature in the range of 600 to 700° C. is used to crystallize the Si film with required period for complete crystallization dependent of the crystallization temperature. The crystallization time (minimum time required to complete the crystallization) at 700° C. is around 5 minutes and the crystallization time increases exponentially with reduction in crystallization temperature. At 600° C., the crystallization time is 10-12 hours. The crystallization times may vary slightly depending upon deposition conditions of amorphous Si films. Since crystallization times increase exponentially with reduction in crystallization temperature, mass production of devices at crystallization temperature below 625° C. or even below 650° C. is impractical. Thus for SPC, the annealing temperature in the range of 625-700° C., or more preferably in the range of 650-700° C., is generally used. In this conventional method, it is known that crystallization starts from an interface 112 between the substrate 110 and the intrinsic Si film 111 (see Spinella and S. Lombardo, J. Appl. Phys. 84, 5383 1998). During the annealing process, the interface 112 becomes stressed due to a difference in thermal expansion coefficient between the substrate 110 and the Si silicon film 111, facilitated by such high annealing temperatures. This stress leads to intra-grain defects (such as dislocation, micro-twins, etc.) during nucleation and grain growth (see D. Pribat, P. Legagneux, F. Plais, C. Reita, F. Petinot, and O. Huet, Materials. Research. Society Symposium Proceedings. 424, 127 1996) phases. These defects propagate throughout the entire crystallizing film 111 as crystallization propagates from this interface 112 to the rest of the Si film 111. The presence of these defects in the crystallized Si film 111 limits the performance of the devices incorporating the polycrystalline silicon film formed using this method.

Figure 2A:
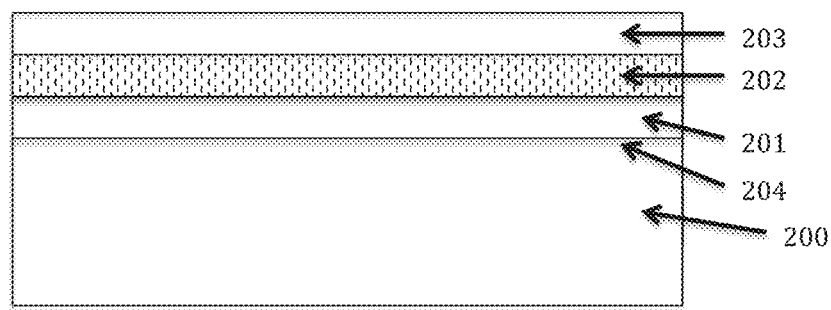
FIG. 2A is a schematic diagram showing a technique of forming a polycrystalline silicon film, according to an embodiment of the present invention.

FIG. 2A is a schematic diagram showing the technique of fabricating polysilicon according to an embodiment of the present invention. As illustrated in FIG. 2A, a substrate 200 is provided. The substrate can be coated with a SiO2 layer or a dual-layer SiN/SiO2 to reduce contamination from glass. When included, these layers are considered herein as part of the substrate. The substrate 200 is a transparent substrate made of glass. Next, a first (bottom) layer 201, initially amorphous, is formed on the substrate 200 by PECVD. The first layer 201 can be intrinsic Si, and can have a thickness of 500 Å, though the thickness can be sized otherwise. Next, a second layer 202, which is a crystallization-initiation layer, is formed on top of the first layer 201. The second layer 202 can be an Si layer, initially amorphous, heavily doped with a dopant. Boron, for example, can be used as a dopant in the embodiment of FIG. 2A such that the second layer 202 is a p-type Si layer. The crystallization-initiation layer 202 can have a thickness of 500 Å and an impurity concentration of $5 \times 10^{20}/cm^3$. A third (top) layer, 203, which can also be intrinsic Si, and initially amorphous, and can have a thickness of about 500 Å, is formed on top of the second layer 202. After forming these three layers 201, 202, 203, thermal annealing is performed to cause the crystallization of the layers 201, 202, 203. Any atmosphere for annealing, including inert atmospheres such as Argon or Nitrogen or oxidizing atmospheres such as oxygen can be used.

A heavily doped a-Si film requires lower thermal budgets to crystallize compared to an intrinsic a-Si film. For example, for an a-Si film doped with a boron concentration of $5 \times 10^{20}$ cm$^{-3}$, the crystallization time at 650° C. is 5 minutes compared to 50 minutes for the intrinsic a-Si films, which is 10 times faster at the same annealing temperature. In the case of intrinsic a-Si films, in order to crystallize it in 5 minutes, the temperature needs to be around 700 degrees Celsius, which is about 50 degrees Celsius higher than that for the boron-doped a-Si film in the same time period. Thus compared to intrinsic a-Si, heavily doped a-Si can be crystallized either at a faster rate exposed to a given, equal temperature, or at a given, equal rate exposed to a lower temperature. Thus, when the structure shown in FIG. 2A is annealed at an elevated temperature, the second layer 202 begins to crystallize first, due to the faster crystallization rate of the second layer 202 compared to the first layer 201 and the third layer 203. In this case, crystallization starts at a location within the second layer 202 spaced apart from the substrate 200 and not at a strained interface 204 between the substrate 200 and the first layer 201. This effect results in lower density of crystalline defects in the crystallizing second layer 202. The crystallization initiated in the second layer 202 then propagates to crystallize the first and third layers 201, 203. The third layer 203 has a lower defect density compared to the first layer 201 because the third layer 203 does not form an interface with the substrate 200. The lower defect density polycrystalline silicon of the third layer 203 can be incorporated in devices, for example as an active layer in thin film transistors, to improve performance of the thin film transistors. In one specific case for the structure in FIG. 2A, the crystallization thermal budget is five minutes at 670° C. to crystallize all the layers 201, 202, 203, when each of the layers is a silicon layer having a thickness of 500 angstroms and the layer 202 is doped with at a boron concentration of $5 \times 10^{20}$ cm$^{-3}$ This thermal budget is lower than that required to crystallize the Si layer 111 formed on the glass substrate 110 shown in FIG. 1. The Si layer 111 of FIG. 1 needs 670° C. to crystallize in 20 minutes, and 700 degrees Celsius to crystallize in five minutes. The 5 minutes at 670° C. discussed with respect to FIG. 2A can be reduced by increasing the temperature, but too high of a temperature, especially beyond 700° C. can cause bending of the substrate 200. Currently, conventional substrates used in TFT industry reach a maximum strain point at 685° C., so currently it can be beneficial to limit the process temperature below 685° C., though for smaller-sized substrates, a temperature of 700-710° C. can be safely used without much bending. At much higher temperatures, the crystallization time difference between the layers becomes very small and it might be difficult to control the crystallization propagation from one layer to another. At temperatures lower than 625° C., the greater length of time required for crystallization affects the productivity. In the example using boron as the dopant for Si in the embodiment of FIG. 2A, a doping concentration of about $1 \times 10^{19}$ cm$^{-3}$ or higher can be needed to reduce the crystallization thermal budget for the doped second film 202. The higher the dopant concentration, the lower the crystallization thermal budget. Accordingly, a higher doping concentration can be preferable to reduce the crystallization thermal budget. At a boron doping of $1 \times 10^{19}$ cm$^{-3}$, the reduction in crystallization thermal budget is not significant for a-Si, so a boron doping concentration of $5 \times 10^{19}$ cm$^{-3}$ or higher can be preferred to have a significant reduction in crystallization thermal budget. A very significant reduction in thermal budget is obtained at a boron concentration of $5 \times 10^{20}$ cm$^{-3}$ in Si. Generally, gas phase doped film (prepared by flowing dopant-containing gases with silicon forming gases during a-Si film deposition process) can have better reduction in crystallization thermal budget than films prepared by first depositing an intrinsic a-Si film followed by implantation of a dopant into the intrinsic a-Si film.

Both boron (p-type dopant) and phosphorus (n-type dopant) are known to reduce crystallization time of a-Si. Either can be used as a dopant for the doped (middle) second layer 202 but boron can be preferable when the layer 202 is a Si layer because boron has a larger effect on the reduction of crystallization time than phosphorus for the case of Si. Also, a larger concentration of phosphorus is needed in a-Si to bring about reduction in crystallization time, such as a concentration of $1 \times 10^{20}$ cm$^{-3}$ or higher, and in some embodiments, around $1 \times 10^{21}$ cm$^{-3}$.

Figure 2B:
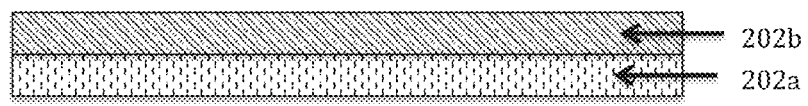
FIG. 2B is a schematic diagram showing a technique of forming a polycrystalline silicon film, according to an embodiment of the present invention.

Referring to FIG. 2B, it is also possible for the second layer 202 to include stacked doped sub-layers, such as a p-type a-Si sub-layer 202a and an n-type a-Si sub-layer 202b, such that crystallization is initiated in one of the doped sub-layers.

Further, referring again to FIG. 2A, the first layer 201 can be doped as well, rather than being intrinsic, as long as the dopant and the dopant concentration for the first layer 201 are chosen so that crystallization will still be initiated in the second layer 202. Doping the first layer 201 of FIG. 2A and initiating crystallization in the second layer 202 can be accomplished, for example, by doping the second layer 202 with a doping concentration higher than that of the first layer 201.

Referring still to FIG. 2A, the thicker the first layer 201, the farther the location of the second layer 202 is from the strained interface 204, and thus the farther the location of crystallization initiation is from the strained interface 204. Thus a thicker first layer 201 will yield a lower defect density in the crystallizing layers, especially in the third layer 203. However, for TFT-array applications, the layer 201, 202, 203 need to be patterned into islands. A higher total thickness for these layers 201, 202, 203 leads to larger step formation at island edges, and would require a good step coverage for subsequently deposited films used in these devices. Thus, it can be beneficial to balance the thickness based on these considerations. The thickness of the first layer 201 may be limited to 1500 Å, and for most applications, it may be in the range of 500-1000 Å. For the second layer 202, a thicker film will give better control over crystallinity of films on either side as crystallization is initiated in the layer 202 and propagates through the layers on either side. For most applications, the second layer 202 being about 500 Å-thick would be suitable, though a thicker second layer 202 would also help reduce thermal budget for crystallization. Thus, a range of 500-1000 Å can be preferable. A thicker second layer 202 would lead to increased total thickness and could cause step coverage issues during TFT formation. For the third layer 203, the thickness desired would depend upon the type of device in which the film is being incorporated. For TFTs, where the top film is to be used as an active layer, generally about 500 Å thickness is used, but a range of 200 to 1000 Å would be suitable most practical applications. A thinner active layer is more suitable when a lower leakage current for the TFTs is desired. For ELA crystallization case of silicon, generally a starting film thickness of about 400-500 Å is used. Upon ELA, however, the surface roughness becomes much larger than the thickness with the crystallized films having peaks and valleys likely caused by surface tension during melting of silicon. Thus, in ELA, further reducing the thickness is not conventionally practical. Thus, a thinner active layer in the current invention is an additional benefit.

Figure 3A:
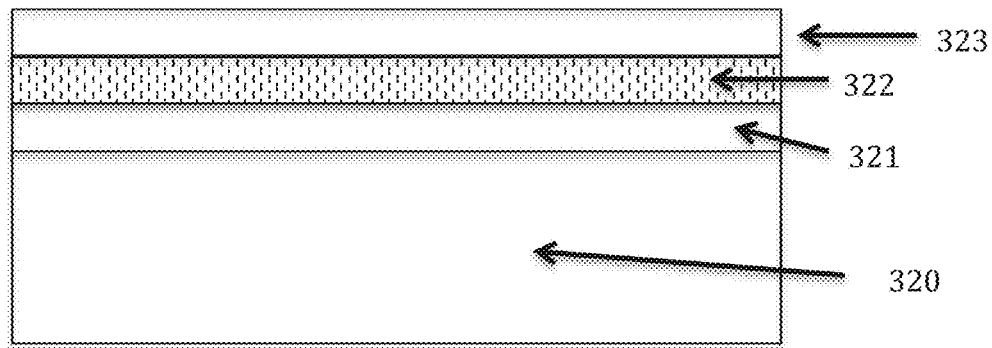
FIG. 3A-D are schematic diagrams showing a method of forming an n-channel polycrystalline silicon thin film transistor, according to an embodiment of the present invention.

FIG. 3A to FIG. 3D are schematic diagrams showing a method of fabricating a polycrystalline Si thin film transistor (TFT) 300. Referring to FIG. 3A, a substrate 320, such as glass, is provided. If needed or desired, the substrate 320 can include a barrier layer (not shown) made of silicon nitride, or silicon oxide or a dual-layer structure consisting of a silicon nitride layer and a silicon layer both can be formed on the substrate to minimize any contamination from the substrate reaching the TFTs. Next a first layer 321, which can be Si and initially amorphous, is formed on the substrate 320 by PECVD. The thickness of the first layer 321 in this case is 500 Å. Next, a second layer 322, which is a crystallization-initiation layer, is formed on top of the first layer 321 by gas phase doping. The second layer 322 can include heavily doped a-Si, and can have a thickness of 500 Å. The dopant, such as Boron, can be concentrated at $5 \times 10^{20}/cm^3$. A third layer 323, which can be intrinsic Si, initially amorphous, and in some embodiments about 500 Å thick, is formed on top of the second layer 322. All three layers 321, 322, 323 are formed by PECVD without breaking vacuum between the depositions. After forming these three layers 321, 322, 323, thermal annealing is carried out to crystallize all three layers 321, 322, 323. The layers 321, 322, 323 in the structure are crystallized at a thermal budget similar to that used for the structure shown in FIG. 2A, as the layer thicknesses and dopant concentrations in this case are similar to those in the structure of FIG. 2A.

Figure 3B:
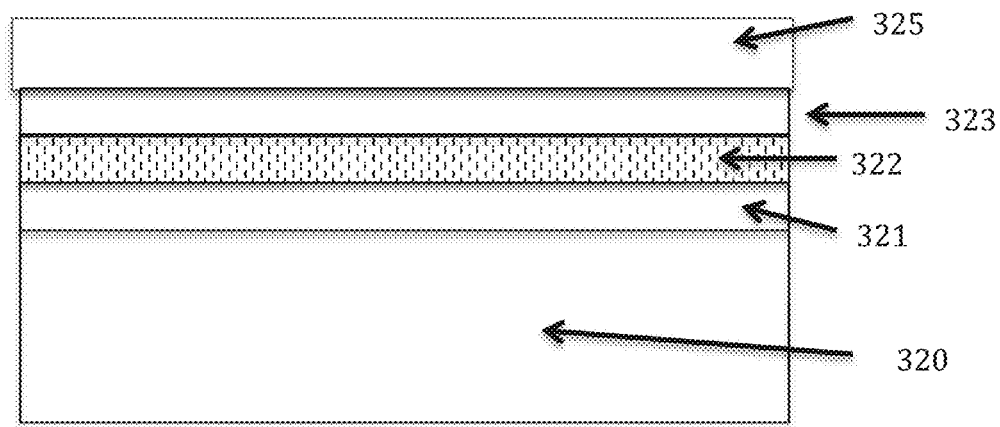
Figure 3C:
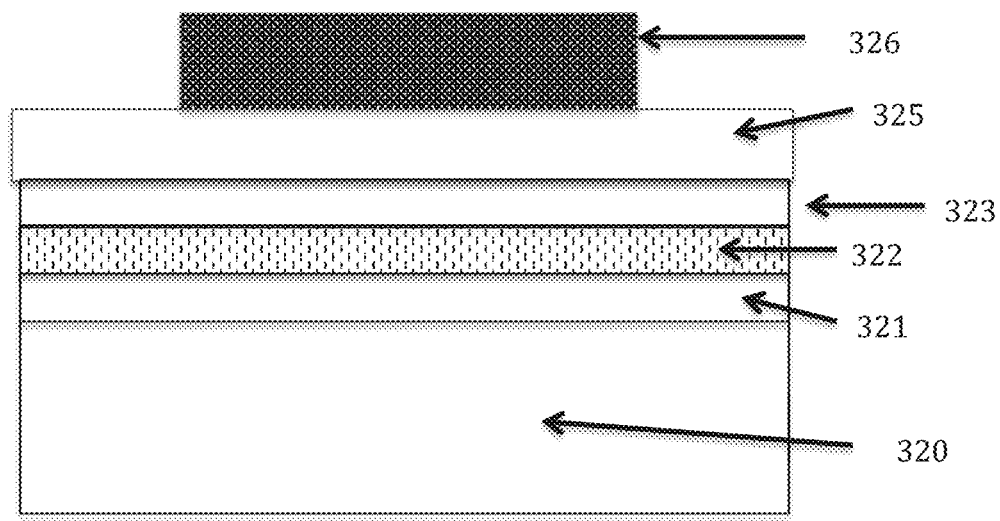
Figure 3D:
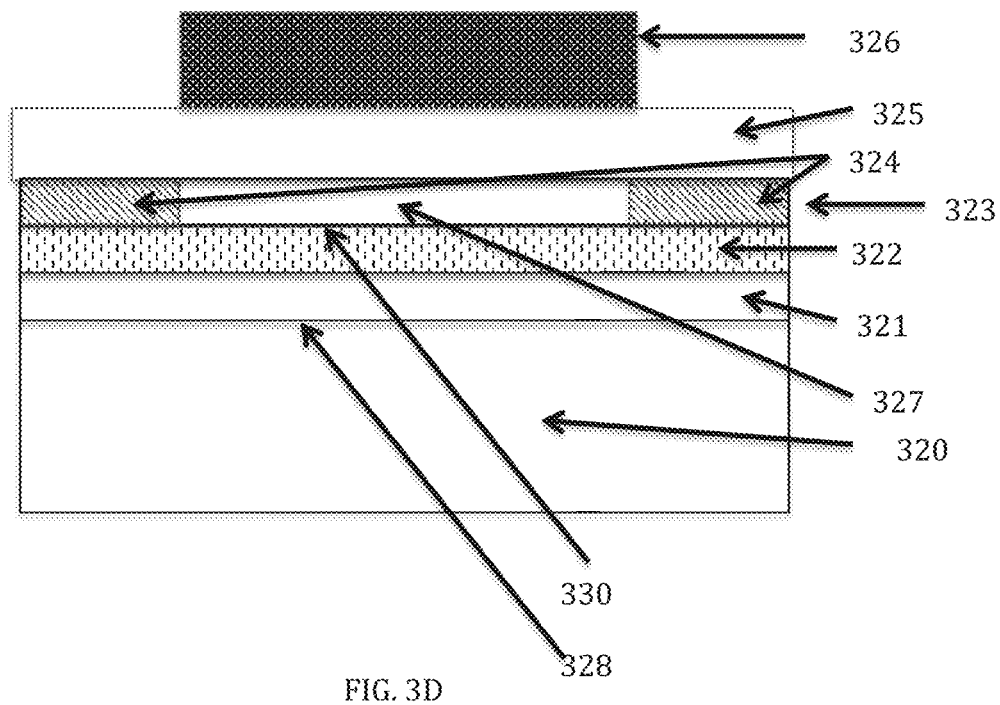

Next, a gate insulator layer 325 is formed over the third layer 323 as shown in FIG. 3B. The gate insulator layer 325 is generally made from $SiO_2$ or a dual layer structure consisting of $SiO_2/SiN$ layers, with $SiO_2$ film being in contact with the third layer 323, which is a polycrystalline silicon layer. A gate electrode pattern 326 is formed on the gate insulator layer 325, as shown in FIG. 3C. Source-drain regions 324 are formed by implanting phosphorus into the third layer 323 through the gate insulator layer 325 using the gate electrode 326 as a mask, as shown in FIG. 3D. A TFT channel 327 is a part of the third layer 323 between the source-drain regions 324. The source-drain regions 324 are doped by a dopant chosen to provide a conductivity type opposite a conductivity type of the second layer 322. Thus, for example, when the second layer 322 is a p-type layer, as is the case if the dopant is boron, then the source-drain regions 324 are n-type doped. The source-drain regions 324 are generally heavily doped (on the order of $1 \times 10^{20}$ cm$^{-3}$ or higher) in order to reduce series resistance to current flow, as well as to reduce TFT leakage current during TFT operation. The source-drain regions 324 may use a lightly doped drain (LDD) structure, where small portions of the source-drain regions 324 have a lower doping concentration compared to the rest of the source-drain regions 324. The LDD structure is used to reduce electric field during device operation in order to improve device reliability and reduce leakage current. The TFT array process can be completed by forming source-drain electrodes (not shown), which contact the source-drain regions 324 through contact holes (not shown) formed in the gate insulator layer 325 as well as by forming other array elements of a display (not shown). The FIG. 3D only shows a basic TFT device and not all the elements used in forming a TFT array.

In the method described with reference to FIG. 3A to 3D, the doping to form the source-drain regions 324 may be performed before or after deposition of the gate insulator layer 325, or after formation of the gate electrode 326. A combination of more than one of the above doping steps can be used to devise various structures such as lightly doped drain (LCD), gate-overlapped lightly doped drain (GOLDD) or GOLDD+LDD structures in the active layer (third layer 323). The channel 327 in the active third layer 323 may be very lightly doped (p-type or n-type) in order to adjust the threshold voltage of the device, but the doping concentrations in this case are much lower, on the order of $1 \times 10^{18}$ cm$^{-3}$ or less. At such doping concentrations, poly Si films are essentially considered intrinsic, as conductivity is generally not affected by such doping (as these dopant concentration levels are close to silicon defect concentration) and thus would be referred to as intrinsic silicon in the discussion.

FIG. 3D depicts an n-channel TFT device, because upon application of positive bias on the gate electrode 326 (on-state condition for n-channel TFTs), an electron channel is induced in the third layer 323 between the source-drain regions 324 and upon application of bias between the source-drain electrodes (not shown), an electron current flows through the n-type source-drain regions 324 to an outside circuit. Hole current because of the presence of doped second layer 322 being p-type and channel-hole current induced upon application of negative gate bias (off-state condition) are restricted due to the presence of n-type source-drain regions 324.

Figure 4A:
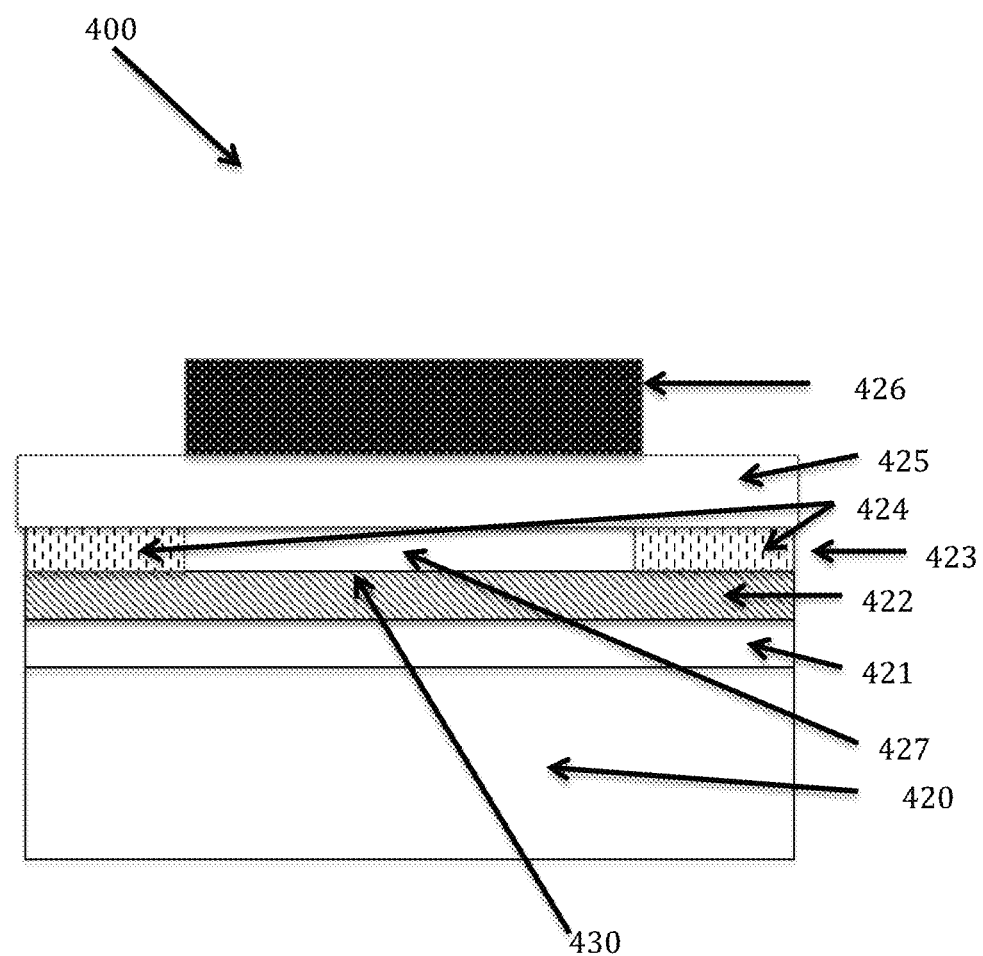
FIG. 4A is a schematic diagram showing a technique of forming a p-channel polycrystalline silicon thin film transistor, according to an embodiment of the present invention.

FIG. 4A is a schematic diagram showing a p-channel polycrystalline Si thin film transistor (TFT) 400 formed according to an embodiment of the present invention. Here the process of TFT formation is generally the same as the process of n-channel TFT formation shown in FIGS. 3A to 3D, but the p-type regions and n-type regions are interchanged. Thus a second layer 422, which is a crystallization-initiation layer, can be an n-type Si (initially amorphous when formed), and source-drain regions 424 can be p-type a-Si regions formed by doping boron into a third layer 423, which can be Si, and is initially amorphous when formed. A first layer 421, which can be Si, and the third layer 423 (both intrinsic and amorphous when formed) sandwich the second layer 422, and the p-channel polycrystalline silicon TFT 400 further includes a gate insulator layer 425, a gate electrode 426, and a substrate 420. In this case, upon application of negative bias on the gate electrode 426 (on-state condition for p-channel TFTs), a hole channel will be induced in the region 427 between source-drain regions 424 in the third layer 423 and upon application of suitable source-drain bias, hole current will flow through the p-type source-drain regions 424. The p-type source-drain regions 424 restrict channel electron current when gate bias is positive (off-state condition for n-channel TFTs), as well as electron current due to a presence of the n-type second layer 422.

During crystallization of the first layer 421, the n-type second layer 422, and the third layer 423, the crystallization thermal budget is approximately five minutes at 690° C. when all the three layer are Si. This thermal budget is larger than a thermal budget of the similar p-type structure of FIG. 2A or FIG. 3A, and only slightly smaller than a thermal budget of the substrate structure shown in FIG. 1. Phosphorus doping to yield the n-type second layer 422 is less effective than boron doping to reduce the crystallization thermal budget of amorphous silicon. In order to reduce thermal budget for crystallization during fabrication of p-channel TFTs, the process and the structure can be modified from the one shown in FIG. 4A.

Figure 4B:
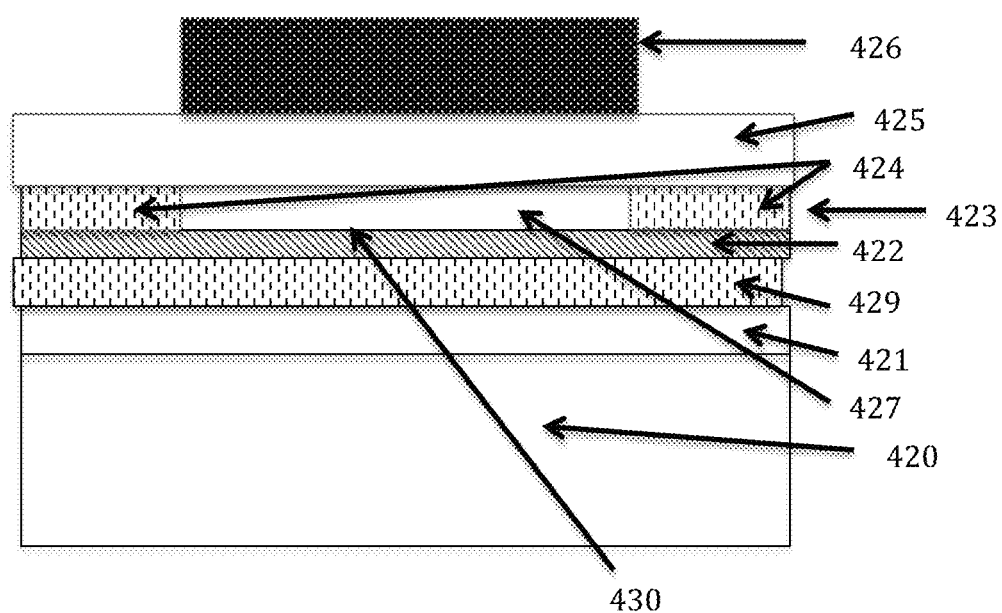
FIG. 4B is a schematic diagram showing a technique of forming a p-channel polycrystalline silicon thin film transistor, according to an embodiment of the present invention.

FIG. 4B shows a modified structure for p-channel devices designed to have a lower thermal budget for crystallization. The structure shown in FIG. 4B is identical to that shown in FIG. 4A, except that a fourth layer 429, which is a second crystallization-initiation layer, is formed between the first layer 421 and the second layer 422. The fourth layer 429 can be a Si layer doped with boron at a concentration of $5 \times 10^{20}$ $cm^{-3}$. This doping is done because boron-doped a-Si requires a much lower thermal budget to crystallize than phosphorus-doped a-Si. Thus, in this case, upon annealing the structure consisting of the four Si layers—the first layer 421, the fourth layer 429, the second layer 422, and the third layer 423—in FIG. 4B, crystallization will start from the fourth layer 429 and will propagate through the n-type second layer 422 and the first and third layers 421, 423. The n-type second layer 422 of FIG. 4B is in contact with the active layer (third layer) 423, as with the structure of FIG. 4A, thus facilitating formation of a p-channel device, as p-type source-drains regions 424 will only allow hole current in channel and limit electron currents from n-type second layer 422 and from channel during positive bias on the gate electrode 426. There is no contribution to the TFT current from the fourth layer 429 (p-type layer) because the fourth layer 429 is separated from the active third layer 323 by the n-type second layer 422. The presence of the fourth layer 429 merely helps reduce a thermal budget for crystallization.

Figure 3E:
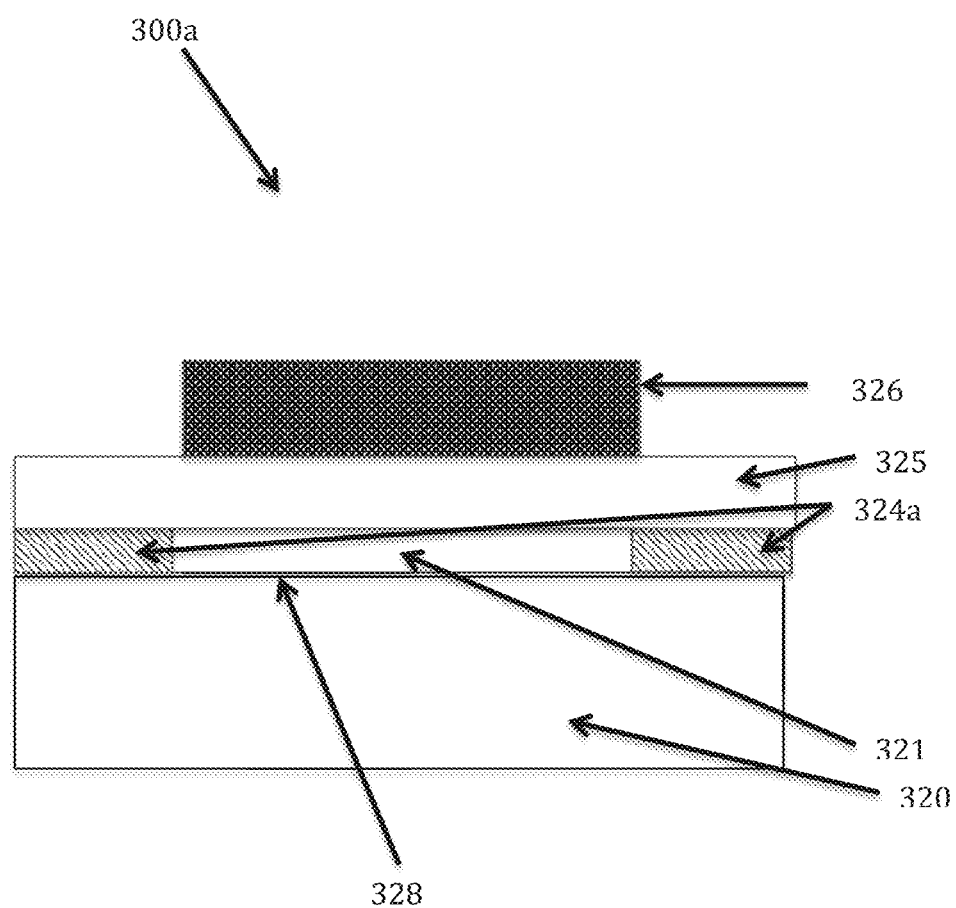
FIG. 3E is a schematic diagram of a TFT formed on a bottom polysilicon layer.

Referring again to FIG. 3D, when the crystallization initiates from the second layer 322, not only does the third layer 323 have low defect density, but also a top part of the first layer 321 (an intrinsic silicon layer) can have low-defect density. Since for a top gate TFT, channel forms near the top of the semiconductor layer, one could make TFT devices having a channel in the top part of the first layer 321 by etching off the second layer 322 after crystallization, in which case there would be no need to form the third layer 323. FIG. 3E illustrates such a TFT 300a. In such a case, source-drain regions 324a are formed in the first layer 321 followed by formation of a gate insulator layer 325 and a gate electrode pattern 326. However, in such a case, plasma used in the etching process creates damage to the top surface of the first layer 321. This damage can be seen as artifacts on the displayed image in AMOLED displays. The artifacts seem to be caused by variation in current characteristics between TFTs caused by etching damage on silicon used for the active layer 321. A significant increase in leakage currents in these TFTs can also result. This leakage current is significantly higher than that seen in TFTs made by incorporating amorphous silicon film crystallized by traditional SPC (for example, in film 111 in FIG. 1). That is because there is high strain between the substrate 320 and the first layer 321, which is approximately similar to strain between the substrate 110 and film 111 in FIG. 1, as crystallization temperature is only a few tens of degrees lower in the former case. This leads to approximately similar number of total defects for the two cases, but since the top part of the layer 321 has fewer defects the defects are concentrated near the bottom part of the first layer 321, that is, near the interface 328 between the substrate 320 and the first layer 321. Thus, it seems that the defects are non-uniformly distributed in the first layer 321 with higher concentration of defects near the interface 328 and lower concentration of defects near the top of the first layer 321. The increased defect concentration near the interface 328 can cause the increased leakage current (current in the off-state).

The mechanism for the increased leakage current due to increase in defect concentration near the interface 328 between first layer 321 and the substrate 320 can be explained as follows. The increased leakage current here is caused by hopping-conduction, according to which carriers (both electrons and holes) hop between defect states, a phenomenon normally observed in crystalline as well amorphous silicon films with very high defect density. In the case of n-channel TFTs, during off-state bias, (negative bias on gate) holes are induced in the channel Thus, current passing through the n-type source-drain is supposed to be minimum (low leakage current) as holes current is restricted by n-type source-drain regions. However, the electron current due to hopping between defect-states present near the interface 328 (between the first layer 321 and the substrate 320) can pass through the n-type source-drain region, which increases the device leakage current.

On the other hand, in the case of having a TFT device formed in the third layer 323 of FIG. 3D, the electron current caused by the defects near the interface 328 between the first intrinsic a-Si layer 321 and the substrate 320 is stopped by the p-type second layer 322, minimizing that contribution. Hole current from that interface 328 is not an issue since all hole currents are restricted in n-channel devices by n-type source-drain regions. Similar reasoning is also true for p-channel TFTs of FIG. 4, except that carrier types and film conductivities are reversed. In the embodiments of FIG. 3D and FIGS. 4A and 4B, wherein the TFT active layer is fabricated in the third layer 323, 423, the active third layer 323, 423 has the interface 330, 430 with the doped silicon second layers 322, 422 such that there is no thermal expansion coefficient mismatch, minimizing or eliminating the interface strain. The low leakage current is very important to reduce power consumption, especially when displays are used in battery-powered devices. The low leakage-current also increases the on/off contrast ratio of AMOLED displays.

The first layer 321, 421 in FIG. 3D, FIG. 4A, or FIG. 4B can be intrinsic silicon film. These layers 321, 421 need not be intrinsic, though, and doped silicon films can be used instead if dopant and/or doping concentration are so chosen that crystallization will still initiate in the second layers (ie., the crystallization-initiation layers) 322, 422, 429 in FIG. 3D, 4A, 4B. Thus, as long as dopant/doping concentrations of the first layer 321, 421 are such that these dopant/doping concentrations require higher thermal budget to crystallize without the presence of the second layer 322, 422, 429 therein, then the crystallization will initiate from the second layer 322, 422, 429 leading to lower defect density in the crystallized silicon layers, especially in the third layer 323, 423 of FIG. 3D, FIG. 4A, and FIG. 4B.

The advantages of using n-type or p-type doped amorphous silicon layers as the layers from where the crystallization initiates is that such dopants are readily available in TFT device fabrication facilities and thus the processes can be easily incorporated into the device fabrication. However, with these dopants, there is a limit on how much the annealing temperature can be reduced. The maximum reduction in crystallization temperature is about 30 degrees Celsius. It is advantageous to be able to reduce crystallization temperature further, and in other case, it may be necessary. It is found that when amorphous germanium ("Ge") is added to amorphous Si to form an amorphous silicon-germanium ("Si—Ge") material, a crystallization temperature of the amorphous Si—Ge material can be reduced by up to 200 degrees Celsius, depending upon the Ge content of the film. Thus such an amorphous Si—Ge layer could be used as a layer between two intrinsic amorphous silicon layers, in place of a doped amorphous silicon layer. The silicon and germanium form a solid solution at all the possible compositions and such films can be formed by deposition methods such as PECVD. In order to use an amorphous Si—Ge layer as a crystallization initiation layer from where crystallization can be propagated to an amorphous silicon layer, the silicon layer and the Si—Ge solid-solution layer must have a lattice match, meaning, both the silicon layer and the Si—Ge solid-solution layer must have the same crystal structure and the difference in lattice constant for the two must at the most be a few percent. Both these requirements are met as both the silicon layer and the Si—Ge solid-solution layer have the same crystal structure upon crystallization, and the maximum difference in lattice constant between the Si and Si—Ge is about 4 percent, when the Ge fraction in the Si—Ge nears 100 percent. Thus in the structure of FIG. 2A, the second layer 202 between the first layer 201 and the third layer 203 can be amorphous Si—Ge or 100 percent Ge instead of a doped amorphous silicon. The Si—Ge solid solution can be written as $Si_xGe_{1-x}$, where x has a value between one and zero and the same formula can be used to include 100 percent Ge if it is included that x equals zero. In this case, upon thermal annealing the crystallization will initiate in the amorphous $Si_xGe_{1-x}$ and propagate through the a-Si layers on either side. The thickness of an Si—Ge layer can be similar to the corresponding Si layer. For example, the thickness of the second layer 202 in FIG. 2A would be similar despite whether the second layer 202 is Si or Si—Ge.

This substitution can be applied to the TFT fabrication process described with respect to FIG. 3D and FIG. 4A. In the TFT structures of FIG. 3D or FIG. 4A, the (amorphous when formed) or 100 percent Ge (amorphous when formed) can replace the p-type silicon second layer 322 or then-type silicon second layer 422, respectively, with the other layers remaining the same, to make p-channel or n-channel TFTs, respectively. Since and Ge are semiconductor materials like silicon, the or 100 percent Ge can be intrinsic or doped to be p-type or n-type. For a case of using intrinsic Si—Ge or intrinsic Ge as a middle layer, either n-channel or p-channel TFTs can be formed depending upon whether the source-drain areas, are doped n-type or p-type, respectively. If a doped Si—Ge layer or a doped a-Ge layer is used, its conductivity type must be opposite the of conductivity type of the source-drain regions. Since Si—Ge or Ge can have a lower crystallization thermal budget than a doped silicon layer, the amorphous silicon first layer 321 or 421 could be a doped layer and still crystallization can be initiated from the amorphous Si—Ge or amorphous Ge layer (from a location spaced apart from the substrate). But if Si—Ge or Ge film is intrinsic and the silicon first layer 321 or 421 is doped, the conductivity type of the silicon first layer must be opposite of that of source-drain regions.

As the Ge fraction increases in the Si—Ge solid solution, the crystallization temperature reduces, which is advantageous, but the electrical band gap also narrows. This narrowing of the electrical band gap increases the intrinsic carrier concentration for both holes and electrons in Si—Ge. This increased carrier concentration in the Si—Ge layer increases the TFT leakage current or off-current. Thus, reduction in crystallization thermal budget must be balanced by requirement for the off-current of the device. If a lower TFT off-leakage current is desired and a higher Ge fraction is required in order to reduce the crystallization temperature, the layer can be doped such that the conductivity-type of the layer is opposite the conductivity-type of the source-drain regions. This would increase the type of carriers in the SiGe, which would be rectified by the source-drain regions, while decreasing the opposite type of carrier which can pass through the source-drain regions. Thus, in FIG. 3D, which is discussed above as being an n-channel device with a p-type Si second layer 322, the second layer 322 can instead be a p-type Si—Ge layer or p-type Ge layer. Similarly in FIG. 4A, which is discussed above as being a p-channel device with an n-type Si second layer 422, the second layer 422 can instead be an n-type Si—Ge or n-type Ge layer. In these cases, even with using 100 percent Ge, one can get low leakage currents. A doping concentration of $5\times10^{18}$ cm$^{-3}$ or higher is needed to move the Fermi level in Si—Ge or Ge to affect the device leakage current. The use of doped $Si_xGe_{1-x}$ for the layers 322 and 422 also has an advantage of electrically isolating the active third layer 323 in FIG. 3D and the active third layer 423 in FIG. 4A from all the semiconductor layers under the doped $Si_xGe_{1-x}$ layer, thereby improving device performance Thus, a doped amorphous $Si_xGe_{1-x}$ is preferred over an undoped amorphous $Si_xGe_{1-x}$ as a crystallization initiation layer. Doping of an amorphous Si—Ge layer can also facilitate further reduction of the crystallization temperature of the Si—Ge layer.

Figure 4C:
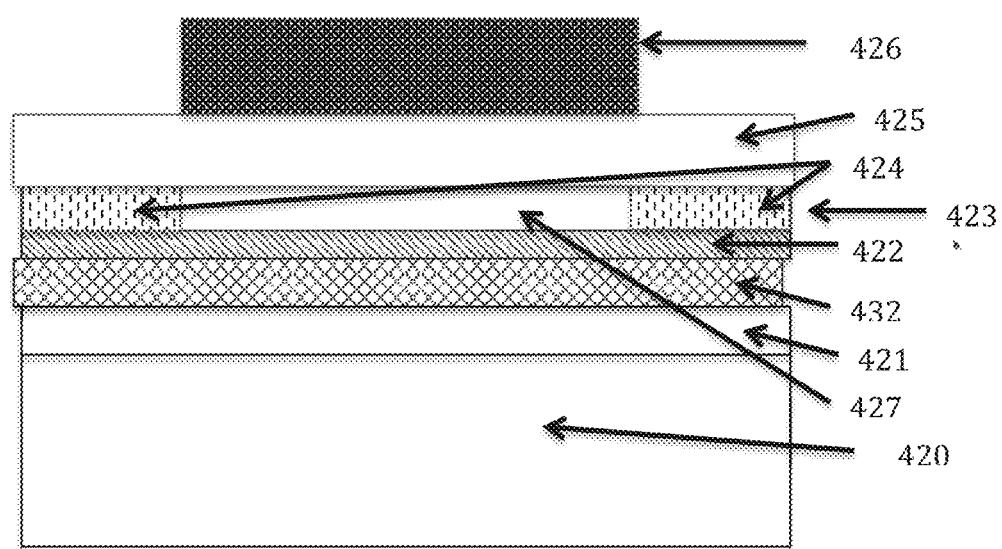
FIG. 4C is a schematic diagram showing a technique of forming a polycrystalline silicon thin film transistor, according to an embodiment of the present invention.

In another embodiment, as illustrated in FIG. 4C, the second layer 422 can be a doped a-Si layer as discussed above, and an additional fifth layer 432, which can be an amorphous Ge or Si—Ge layer, can be placed between the first layer 421 and the second layer 422. In this case, the crystallization initiates in the amorphous Ge or Si—Ge fifth layer 432, and crystal growth propagates through all the a Si layers on either side of the Ge or SiGe fifth layer 432. When the Ge or Si—Ge fifth layer 432 is placed under the second layer 202, 422 as described above, the Ge or Si—Ge layer 432 is not in contact with the active layer 423. Thus, Ge or Si—Ge does not have to be the opposite conductivity type of the source-drain regions. Ge or SiGe can be intrinsic or any conductivity type. The leakage current in this case is the lower, compared to the devices where the Ge or Si—Ge is directly contacting the active layer, because the leakage current in this case is controlled by an interface of the doped second layer 422 and the active third layer 423, both of which are silicon, thus have no thermal mismatch between them. The device performance in this case is not affected by the use of either a doped or an undoped Si—Ge layer, because the doped silicon second layer 422 electrically isolates the active third layer 423 from the rest of the semiconductor films below it. Again, the first layer 421 can also be a doped silicon layer and crystallization can still be initiated from the Si—Ge or Ge second layer 422. The first layer 421 can be either an p-type or n-type silicon, since the doped second layer 422 electrically isolates the active third layer 423 from the other semiconductor films below the second layer 422.

Similarly for FIG. 3D and FIG. 2A, the second layers 322, 202 can be doped a-Si and an additional amorphous Ge or Si—Ge layer can be placed between the first layer 321, 201 and the second layer 322, 202.

In FIG. 2A, the first layer 201 can be Si—Ge (formed as amorphous) or Ge (formed as amorphous) instead of the Si. This first layer 201 can be represented by a formula $Si_{x1}Ge_{1-x1}$, where x1 has a value between zero and one, including zero. Also, the second layer 202 can be Si—Ge (formed as amorphous) or Ge (formed as amorphous), represented by a formula $Si_{x2}Ge_{1-x2}$, where x2 has a value between one and zero, including zero. The composition and/or doping for these two layers 201, 202 are so chosen that the $Si_{x2}Ge_{1-x2}$ layer 202 has a lower thermal budget for crystallization compared to that for the $Si_{x1}Ge_{1-x1}$ layer 201.

There are various approaches to achieve a lower crystallization thermal budget for the $Si_{x2}Ge_{1-x2}$ second layer 202 compared to that for the $Si_{x1}Ge_{1-x1}$ first layer 201. Examples include, but are not limited to; having a higher Ge fraction in the second layer 202 compared to that in the first layer 201 (that is, x2<x1), including 100 percent Ge (x2 equal to zero). Alternatively, both the first layer 201 and the second layer 202 can have similar compositions (including both having 100 percent Ge), but with the second layer 202 having a higher doping concentration compared to that for the first layer 201 (including the condition that the layer 201 is intrinsic), or by choosing a dopant for the second layer 202 that brings down crystallization thermal budget more compared to that chosen for the first layer 201, or a combination of any or all of these variables. Because the Ge fraction of an Si—Ge layer has a larger effect on crystallization thermal budget compared to the choice of dopant material or the doping concentration, it is possible to have lower crystallization thermal budget for the $Si_{x2}Ge_{1-x2}$ second layer 202 by having a higher Ge content compared that for the $Si_{x1}Ge_{1-x1}$ first layer 201, regardless of the dopant material used in each layer or relative doping concentrations of the two layers 201, 202. Accordingly, the $Si_{x1}Ge_{1-x1}$ layer 201 can have a higher doping concentration and the $Si_{x2}Ge_{1-x2}$ second layer 202 can still have a lower thermal budget for crystallization by having a higher Ge fraction. Also, because choice of a dopant material has larger effect on crystallization thermal budget than does doping concentration, the $Si_{x2}Ge_{1-x2}$ second layer 202 can have a lower crystallization thermal budget, even when the doping concentration of the $Si_{x2}Ge_{1-x2}$ second layer 202 is lower than the $Si_{x1}Ge_{1-x1}$ first layer 201 having a similar Ge fraction, if the dopant chosen for the $Si_{x2}Ge_{1-x2}$ second layer 202 reduces thermal budget for crystallization more than that chosen for the $Si_{x1}Ge_{1-x1}$ first layer 201. Thus, there are many combinations of the Si—Ge compositions, dopants materials, and doping concentrations that can result in lower crystallization thermal budget for the $Si_{x2}Ge_{1-x2}$ second layer 202 than that for the $Si_{x1}Ge_{1-x1}$ first layer 201. Having a lower thermal budget for crystallization for the second layer 202 than the first layer 201 facilitates initiation of the crystallization from a location spaced apart from the substrate.

This substitution of Si—Ge or Ge can also be applied to the TFT fabrication process described with respect to FIG. 3D and FIG. 4A. In the TFT structures of FIG. 3D or FIG. 4A, the first layers 321, 421 can be $Si_{x1}Ge_{1-x1}$ rather than Si, and the second layers 322, 422 can be $Si_{x2}Ge_{1-x2}$, to make p-channel or n-channel TFTs. The $Si_{x2}Ge_{1-x2}$ can be intrinsic or doped to be p-type or n-type. For a case of using intrinsic $Si_{x2}Ge_{1-x2}$, either n-channel or p-channel TFTs can be formed depending upon whether the source-drain areas are doped n-type or p-type, respectively. If a doped $Si_{x2}Ge_{1-x2}$, is used its conductivity type must be opposite the conductivity type of the source-drain regions. If $Si_{x2}Ge_{1-x2}$ film is intrinsic and the $Si_{x1}Ge_{1-x1}$ layer is doped, its conductivity type must be opposite that of the source-drain regions.

For the TFT structure of FIG. 4C, a similar substitution can be made. The first layer 421 can alternatively be $Si_{x1}Ge_{1-x1}$, and the fifth layer 432 can be $Si_{x2}Ge_{1-x2}$, with the condition that the $Si_{x2}Ge_{1-x2}$ fifth layer 432 has lower crystallization thermal budget than the $Si_{x1}Ge_{1-x1}$ first layer 421. The second layer 422 is a doped silicon layer with a conductivity type opposite that of the source-drain regions 424. Because the second layer 422 is a doped layer, which electrically isolates the TFT device from layers underneath it, the conductivity type of the $Si_{x2}Ge_{1-x2}$ fifth layer 432 and the $Si_{x1}Ge_{1-x1}$ first layer 421, do not affect the electrical performance of the device. Thus, the first layer 421 and the fifth layer 432 can be intrinsic or doped any type.

Similarly, in the structure described above with respect to FIG. 2A and FIG. 3D, a doped silicon layer can be between the $Si_{x2}Ge_{1-x2}$ second layer 202 and the third layer 203, and between the $Si_{x2}Ge_{1-x2}$ second layer 322 and the third layer 323, respectively, the first layer 201, 321 being $Si_{x1}Ge_{1-x1}$.

For the crystallization process, annealing can be done in a furnace or by using lamps (such as in rapid thermal annealing or RTA). Another way to cause crystallization is by a process called metal-induced crystallization, where a metal, such as nickel or palladium acts as a catalyst for crystallization of amorphous silicon, which lowers the crystallization temperature by as much as 200-300 degrees C. Traditionally, in a metal-induced crystallization process, a thin layer of nickel or palladium is directly placed over a-Si (such as on film 111 in FIG. 1), however, incorporation of nickel or palladium into crystallizing silicon negatively affects device performance. Alternatively, nickel has been placed discontinuously (in a pattern form) over an a-Si film, and upon annealing, silicon crystals grow laterally in the amorphous silicon film from under the Ni patterns to where there is no nickel. This nickel induced lateral crystal growth in the silicon can proceed several micrometers from the nickel patterns in a reasonable time at temperature below 500° C. or even at 400° C. The mechanism by which nickel induced lateral crystallization takes place is as follows. The Ni forms nickel silicide by reacting with amorphous silicon under the patterns. The nickel silicide further reacts with any adjacent amorphous silicon, and in doing so, gives up silicon from previously formed nickel silicide. The dissociated silicon from the nickel silicide is in crystalline silicon. This reaction of consuming amorphous silicon and leaving behind crystalline silicon proceeds since the reaction is energetically favorable. The overall reaction of amorphous to crystalline silicon transition lowers the system energy. Thus, a nickel front (in the form of nickel silicide) keeps moving laterally as long as there is amorphous silicon available and as long as there is adequate temperature to overcome activation energy for the reaction to proceed. The nickel incorporation in the lateral crystal growth regions, where there is no nickel pattern, is much lower than the regions under the nickel pattern. This technique is referred to as metal induced lateral crystallization, or the technique can be simply referred to as metal-induced-crystallization. TFTs have been fabricated by placing nickel patterns located several micrometer apart over an amorphous silicon film, annealing to cause lateral crystallization of the a-Si between the patterns, and forming active layer of TFTs within the laterally crystallized silicon. Although the nickel incorporation in the laterally crystallized silicon is lower compared to nickel incorporation in silicon directly under the nickel, there is still some nickel present in the lateral growth area. This presence of nickel in laterally crystallized silicon can affect random TFTs formed using this technique, and can be seen on a displayed image as a defect (e.g. a bright pixel). Thus TFTs fabricated by using polycrystalline silicon film formed by metal induced crystallization are currently not used in display production, in spite of having an advantage of lower crystallization temperature.

The metal induced lateral crystallization technique can be applied to the TFT process of the current invention with a benefit of lower nickel incorporation in the active layer of the TFT.

Figure 7A:
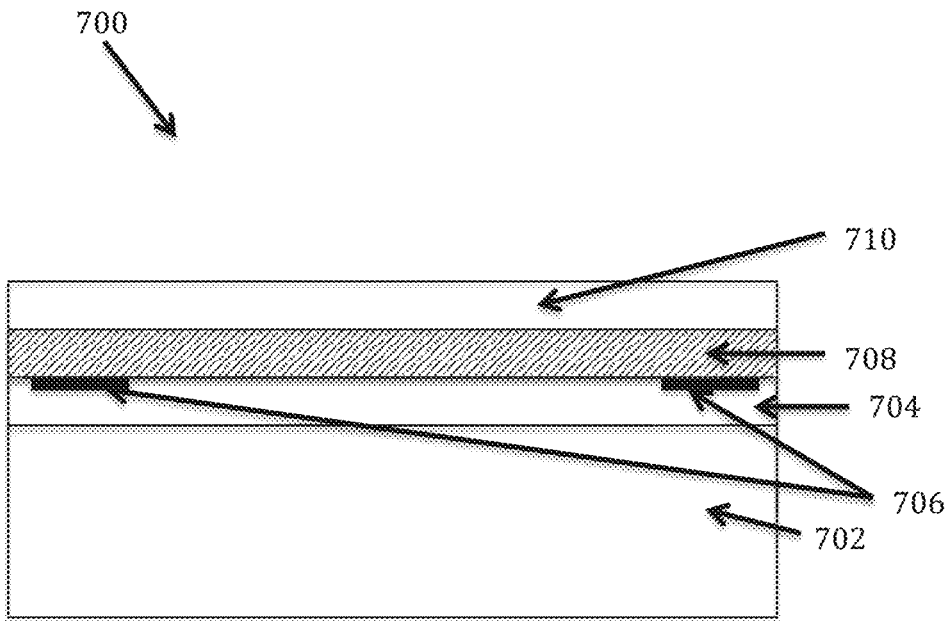
FIG. 7A is a schematic diagram showing a technique of forming a polycrystalline silicon film with the help of a metal catalyst, according to an embodiment of the present invention.

FIG. 7A is a schematic diagram showing the technique of fabricating a polysilicon 700 incorporating a metal induced crystallization process according to an embodiment of the present invention. As illustrated in FIG. 7A, a substrate 702 is provided. Next a first intrinsic Si layer 704, initially amorphous when formed, is formed on the glass substrate 702 by PECVD. The thickness of the first Si layer 704 in this case is 500 Å. Next, nickel patterns 706, are formed on the first a-Si film 704, with a thickness of about 20 Å. The nickel patterns 706 can have a higher thickness, but it can be preferable that the nickel patterns be as thin as possible to minimize nickel incorporation in the TFT channel area. Next, a first doped Si layer 708, amorphous, and heavily doped with phosphorous to create an n-type layer, having a thickness of 500 Å and an impurity concentration of $5\times10^{20}/cm^3$, is formed on top of the first intrinsic Si layer 704. A second intrinsic Si layer 710, amorphous at formation, 500 Å thick, is formed on top of the first doped Si layer 708. After forming these three layers 704, 708, 710, and the nickel patterns 706, thermal annealing is carried out to cause the crystallization of the a-Si films 704, 708, 710 by nickel induced lateral crystallization. As per the principle of nickel-induced crystallization, the crystals in the first intrinsic a-Si film 704 grow laterally between the nickel patterns 706 and crystallize the areas between the nickel patterns 706. Nickel also diffuses downwards from the nickel patterns 706 into the first intrinsic Si layer 704 and upward into the first doped layer 708, and from the first intrinsic Si layer 704 and the first doped Si layer 708 crystals grow laterally through the first intrinsic Si layer 704 and the first doped Si layer 708. Because the phosphorus is a good gettering agent of nickel, however, the nickel concentration reduces more rapidly as it moves upward, and for a thick enough doped Si layer 708, the concentration reaching the second Si layer 710 can be reduced very much. If there is enough nickel reaching into the second intrinsic Si layer 710, in the areas of the second intrinsic Si layer 710 vertically above the nickel patterns 704, the lateral crystal growth takes place from these areas. The nickel incorporation in the laterally grown crystal region of the second intrinsic Si layer 710, however, is lower due to the gettering effect of the first doped Si layer 708. This effect reduces the negative impact of nickel on TFTs fabricated incorporating the laterally-crystallized second intrinsic Si layer 710. If there is not enough nickel reaching the second intrinsic Si layer 710, then the lateral crystallization occurs in the first intrinsic Si layer 704 and in the first doped Si layer 708, and then also from the laterally grown silicon in the first doped Si layer 708, the crystals' growth propagates upward through the second intrinsic Si layer 710. The crystallized second Si layer 710 can be used to form an active layer of a TFT.

Figure 7B:
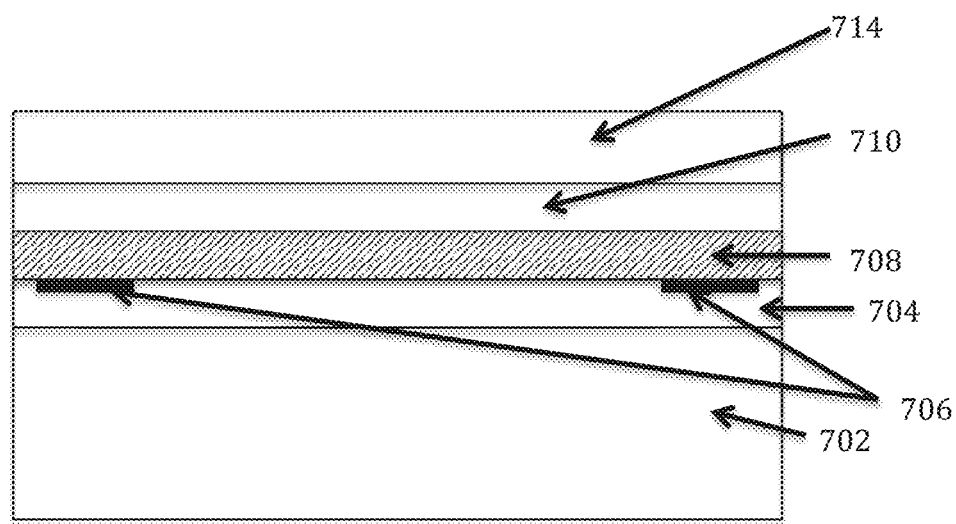
FIG. 7B-D are schematic diagrams showing a method of forming a p-channel polycrystalline silicon thin film transistor with the help of a metal catalyst, according to an embodiment of the present invention.
Figure 7C:
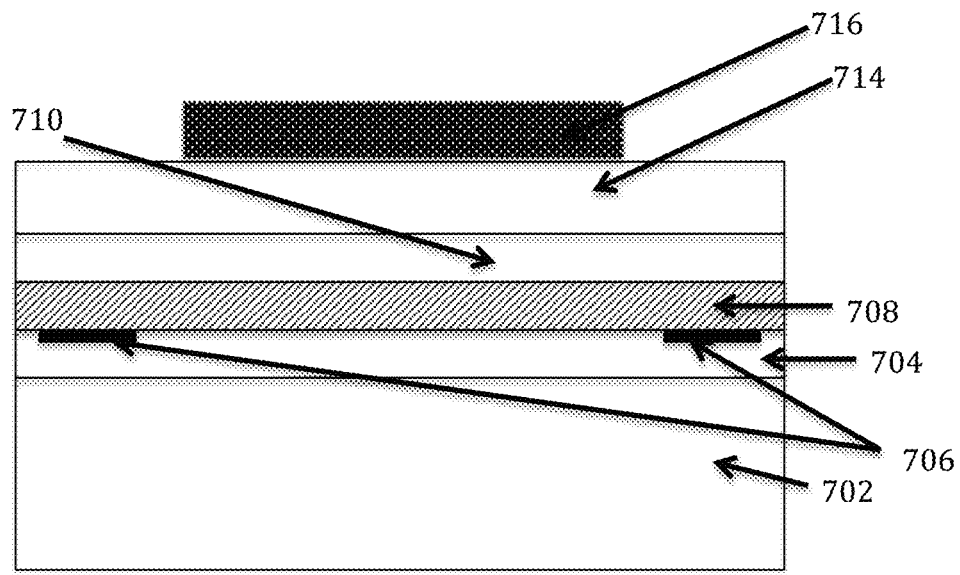
Figure 7D:
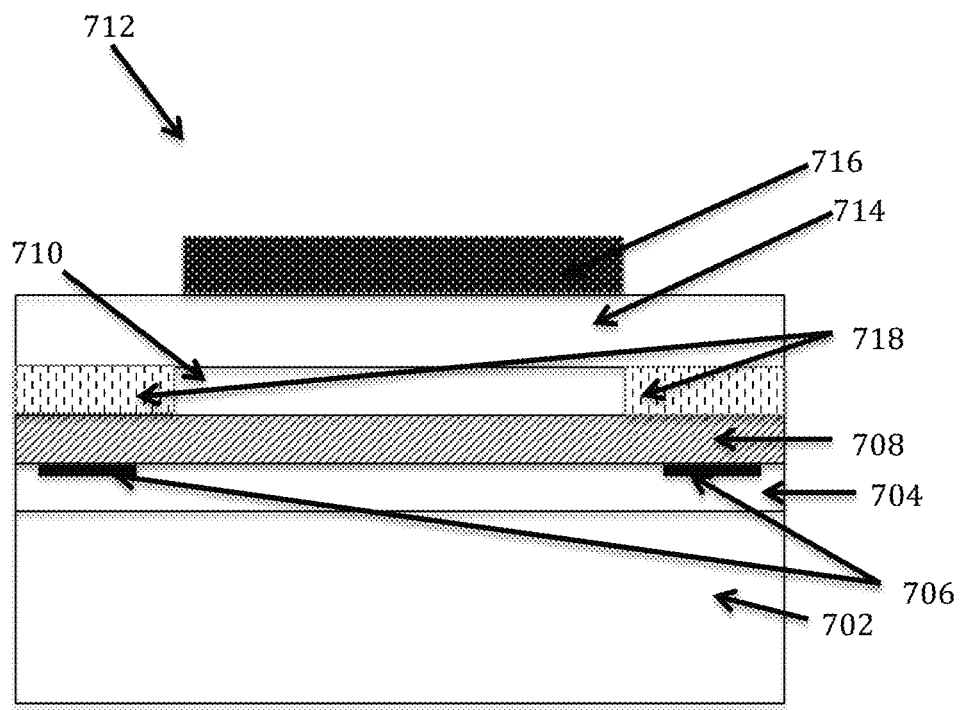

Formation of a TFT device 712 (see FIG. 7D) using the second intrinsic Si layer 710 as an active layer can be made by the method shown in FIG. 7B to FIG. 7D. A gate insulator layer 714 is formed over the active layer 710 as shown in FIG. 7B. A gate electrode pattern 716 is formed over the gate insulator layer 714, as shown in FIG. 7C. As shown in FIG. 7D, P-type source-drain regions 718 are formed in the active layer 710 by implanting the active layer 710 with boron through the gate insulator layer 714, using the gate electrode pattern 716 as a mask. Outside contacts to the source-drain regions 718 are made by forming holes (not shown) in the gate insulator over the source-drain regions 718 and by forming source-drain electrodes (not shown) contacting the source-drain regions 718 through these holes. The resulting TFT device 712 shown in FIG. D is a p-channel TFT with p-type source drain regions 718 allowing hole-current to flow through during a negative bias on the gate while restricting electrons flow through channel during application of a positive bias on gate and through the n-type first doped Si layer 708.

Figure 7E:
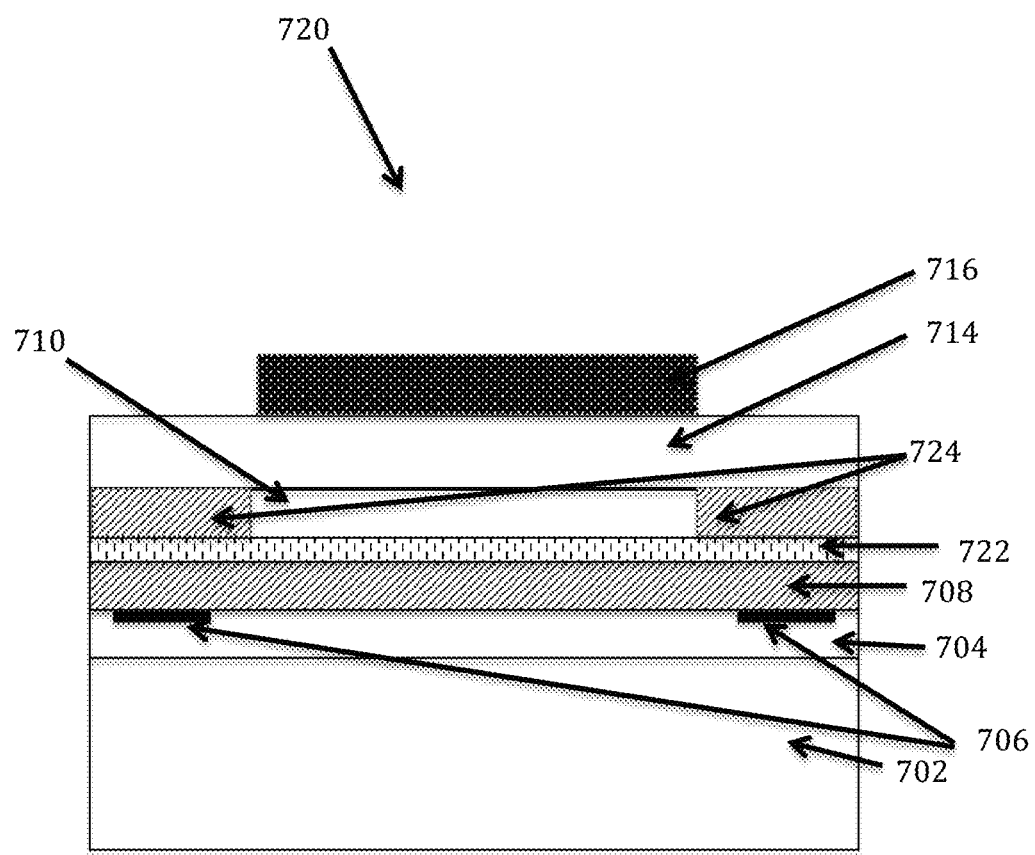
FIG. 7E is a schematic diagram showing a technique of forming a n-channel polycrystalline silicon thin film transistor with the help of a metal catalyst, according to an embodiment of the present invention.

FIG. 7E illustrates an n-channel TFT 720, which is similar to the TFT 712 of FIG. 7D, and is made by a similar method, with some particular differences. An additional p-type Si layer 722, amorphous at formation, is formed between the first doped Si layer 708 and the second intrinsic Si layer 710. Source-drain regions 724 are n-type silicon in this case, formed by doping an n-type dopant into the second intrinsic Si layer 710. The other layers in FIG. 7E are the same as corresponding layers in FIG. 7D. The n-type source-drain regions 724 easily allow electron current through channel during application of positive bias on gate, while restricting the hole current through channel during application of negative bias on gate and through the p-type doped Si 722, and thus forming an n-channel device.

Again the source-drain regions 718, 724 in the above cases can be formed by a combination of doping steps such as; doping before or after deposition of the gate insulator layer 714 and doping after formation of the gate electrode pattern 716, in order to form various LDD structures, as was discussed above.

Nickel from the nickel patterns 706 can quickly travel vertically across the thickness of the first intrinsic Si layer 704, since the thickness is only on the order of several hundred angstroms. Thus, the nickel patterns 706 can be placed under the first intrinsic Si layer 704 instead of above the first intrinsic Si layer. The first intrinsic Si layer 704 can also be eliminated and the nickel patterns 706 can be formed directly on the substrate 702, followed by forming the first doped Si layer 708, with subsequent steps being the same as described above with respect to FIG. 7B-FIG. 7D. Eliminating the first intrinsic Si layer 704, allows for a thicker first doped Si layer 708 because total thickness of all the Si layers 704, 708, 710 is limited by step-coverage considerations during TFT fabrication. A thicker first doped Si layer in turn will lead to increased nickel gettering and thus reduce nickel incorporation in the second intrinsic Si layer 710. The thickness values of the various silicon layers can be similar to thickness values for corresponding silicon layers in the TFTs shown in FIG. 3D and FIG. 4A.

Figure 5:
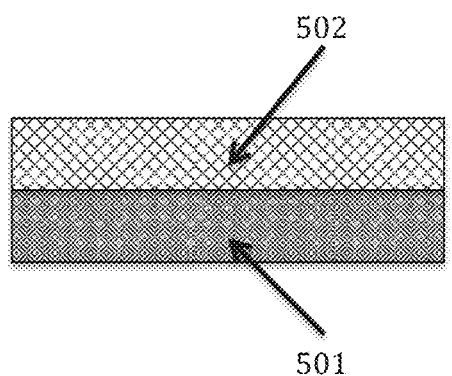
FIG. 5 is a schematic diagram showing a nickel pattern with a barrier layer on the top of the pattern, according to an embodiment of the present invention.

The nickel incorporation in regions of the silicon layers vertically above and below the nickel patterns is the highest. In order to reduce nickel incorporation further in the second intrinsic Si layer 710, a barrier layer to nickel diffusion can be formed over the top surface of the nickel patterns 706, thereby reducing the nickel incorporation in the region vertically above the nickel patterns, thus further reducing nickel incorporation in laterally crystallized regions of the silicon layers 708, 710. FIG. 5 shows a schematic of a barrier layer pattern 502 over a nickel pattern 501. The barrier layer pattern 502 can include, but is not limited to including, SiN, another metal, etc.

Figure 8A:
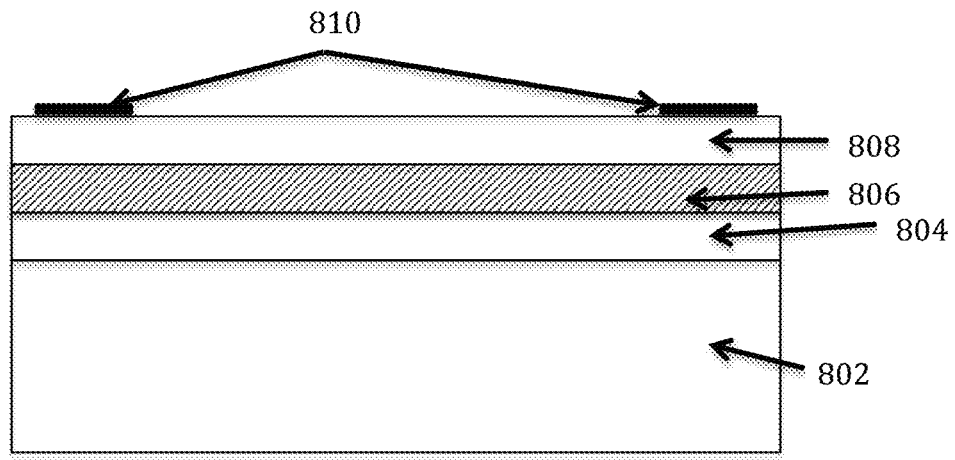
FIG. 8A is a schematic diagram showing a technique of forming a polycrystalline silicon film with the help of a metal catalyst, according to an embodiment of the present invention.
Figure 8B:
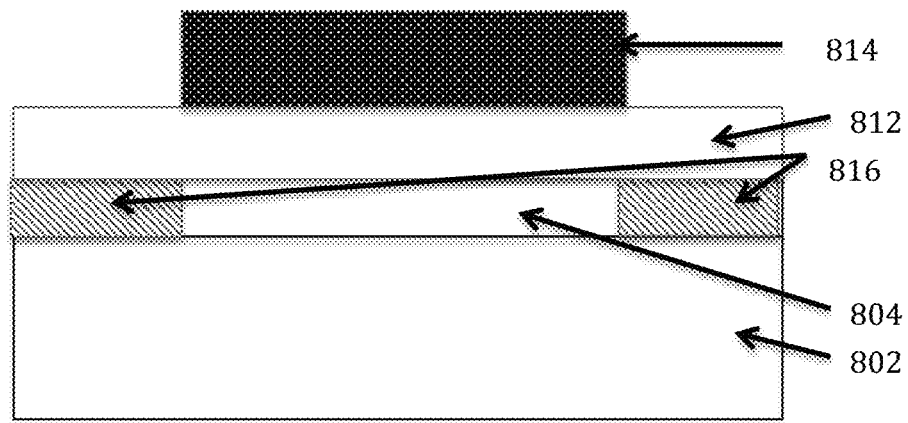
FIG. 8B is a schematic diagram showing a technique of forming a polycrystalline silicon thin film transistor with the help of a metal catalyst, according to an embodiment of the present invention.

FIGS. 8A and 8B shows an alternative way to involve a metal induced crystallization process into the fabrication of a TFT 800. In FIG. 8A, a first intrinsic Si layer 804 is formed on a substrate 802, followed by a first doped Si layer 806 doped for example with phosphorus at a concentration of $5 \times 10^{20}$ cm$^{-3}$, and a second intrinsic Si layer 808. The first intrinsic layer 804 and the second intrinsic layer 808 are initially amorphous. Nickel patterns 810, each about 20 angstrom thick, are formed on the second intrinsic Si layer 808. Upon annealing, the crystals grow laterally in the second intrinsic layer 808 starting from the nickel patterns 810. Nickel also travels downwards from the nickel patterns 810 into the first doped Si layer 806, where lateral crystallization ensues. The first doped Si layer 806 also getters to reduce nickel incorporation in the first intrinsic Si layer 804. Eventually the first intrinsic silicon layer 804 crystallizes either from nickel induced lateral crystallization or if not enough nickel reaches the first intrinsic Si layer 804, then by crystal growth propagation from the laterally crystallized first doped Si layer 806 above the first intrinsic Si layer 804. The layers 806, 808 can be etched off, and the crystallized first intrinsic Si layer 804 can be used for forming an active layer for device fabrication. Because the lateral crystallization in the top part of the first intrinsic Si layer 804 initiates away from the substrate or it propagates vertically from the laterally crystallized first doped Si layer 806, and because the crystallization temperature is much lower compared to that for the SPC case (about 300 degrees Celsius lower), the defect formations in the top part of the first intrinsic Si layer 804, the part where the channel would be located, as well as at the interface between the first intrinsic Si layer 804 and the substrate 802 are much lower. Additionally, because of lateral crystal growth, there is only one grain-boundary perpendicular to the lateral growth direction, (at a location where two nickel fronts travelling from opposite directions meet). Thus, current flowing form source to drain regions only encounters one grain boundary, thus reducing the number of trapping defects to the current flow. There are other parallel grain boundaries in two other dimensions, but they are parallel to the current flow direction so do not impede carrier flow. The etching of the first doped Si layer 806 above the first intrinsic Si layer 804 creates artifacts in AMOLEDs, but these artifacts do not have issues in LCD application, as LCDs are voltage driven devices (AMOLEDs are current driven devices) and sensitivity to current variation due to damage on silicon surface during the etching is not applicable.

FIG. 8B shows the TFT fabrication process incorporating the crystallized first intrinsic Si layer 804. A gate insulator layer 812 is formed over the first intrinsic Si layer 804 and a gate electrode pattern 814 is formed over the insulator layer 812. The source-drain regions 816, are formed by doping portions of the first intrinsic Si layer 804, either p-type or n-type depending upon whether the intended device is p-channel or n-channel, respectively, to form either p-channel or n-channel TFTs. Since both n-channel and p-channel TFTs can be formed just by changing source-drain doping type, the TFT 800 is useful in peripheral circuits of displays, where a CMOS design is preferred.

In another embodiment of FIG. 8A, the second intrinsic Si layer 808 is not formed and the nickel patterns 810 are formed directly on the first doped Si layer 806. The first doped Si layer 806 and the first intrinsic Si layer 804 are laterally crystallized as discussed above. The first doped Si layer 806 can be etched off and the crystallized first intrinsic Si layer 804 can be used for device fabrication as discussed above to form the TFT 800 in FIG. 8B. This alternative allows use of a thicker first doped Si layer 806, thereby reducing nickel incorporation in the first intrinsic Si layer 804.

Figure 6:
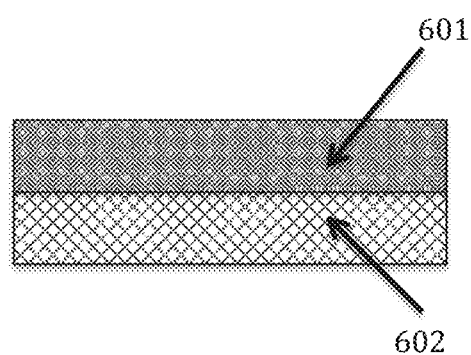
FIG. 6 is a schematic diagram showing a nickel pattern with a barrier layer on bottom surface of the pattern, according to an embodiment of the present invention.

In order to further reduce nickel incorporation in the Si layers 804, 806, a barrier layer pattern under the bottom surface of nickel pattern 810 can be formed. A schematic of a barrier layer 602 under nickel pattern 601 is shown in FIG. 6.

The starting thickness of the first intrinsic Si layer 804 can be 750 angstroms or higher, as during the etching of the Si layers 806, 808, some over-etching into the first intrinsic Si layer 804 can facilitate complete removal of the first doped layer 806. The higher the total thickness of the Si layers 806, 808, the higher the over-etching margin necessary. Since the layers above the first intrinsic Si layer 804 are etched off later, those layers would not add to the step-depth of island patterns formed in the first intrinsic Si layer 804 during TFT fabrication process. Thus, the maximum thickness of the first intrinsic Si layer 804 can preferably be as high as 2000 angstrom. The first doped Si layer 806 can preferably be in the range of 500-1000 angstrom, as further increasing the thickness increases the amount to be etched above the first intrinsic Si layer 804, and would require a larger safety margin for the first intrinsic Si layer 804 during over-etching. If the second intrinsic Si layer 808 is not used, the thickness of the first doped silicon layer 802 can be thicker, such as up to 1500 angstroms.

Figure 9A:
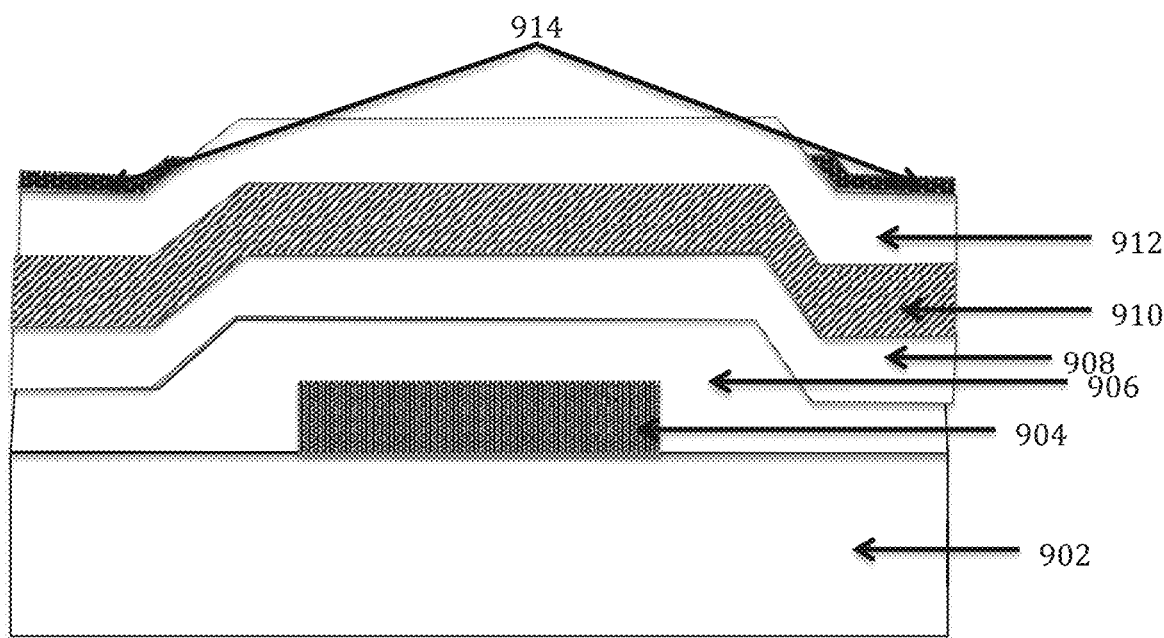
FIGS. 9A and 9B show schematic diagrams of a method for forming a bottom-gate polycrystalline silicon thin film transistor with the help of a metal catalyst, according to an embodiment of the present invention.
Figure 9B:
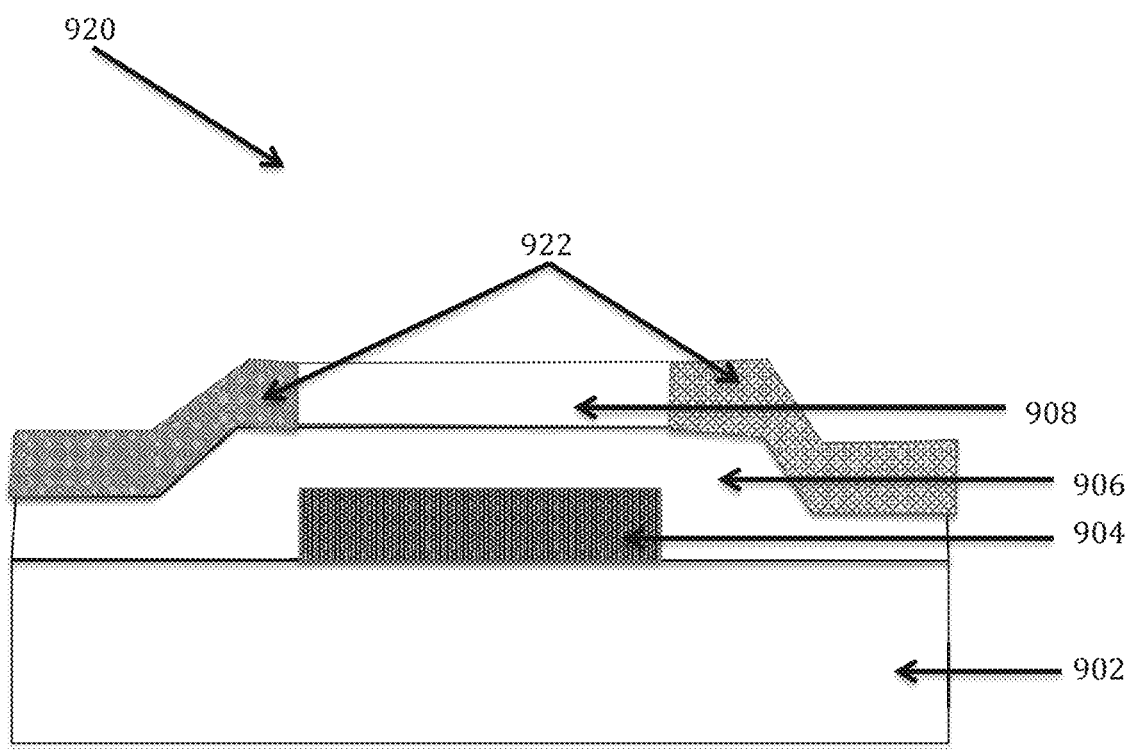

The above process forms a top gate structure TFT as the gate is located above the active layer. Alternatively, a gate can be placed under the active layer to form a structure referred to as bottom-gate structure. FIGS. 9A and 9B show a process of forming a bottom gate TFT 900 incorporating a poly Si active layer formed as per the nickel induced crystallization method.

Referring to FIG. 9A, a substrate 902, such as glass, is provided as shown in FIG. 9A. A gate electrode pattern 904 is formed on the substrate 902. A gate insulator layer 906 is formed covering the gate electrode pattern 904 and the substrate 902 as shown in the FIG. 9A. Next, a first Si layer 908, amorphous initially, is formed over the gate insulator layer 906. The thickness of the first Si layer 908, can be, for example, 1000 Å. Next, a first doped Si layer 910, amorphous initially, having a thickness of 500 Å and a phosphorous doping concentration of $5 \times 10^{20}$/cm$^{-3}$, is formed on top of the first intrinsic Si film 908 by gas phase doping. A second intrinsic silicon layer 912, amorphous initially, 500 angstroms thick, is formed on top of the first doped layer 910. All the layers (gate insulator layer and silicon layers) can be formed by PECVD without breaking a vacuum between the depositions. Nickel patterns 914 about 20 angstrom thick are formed over the second intrinsic Si layer 912. The nickel patterns 914 are formed such that there is no nickel layer on a part of the second intrinsic Si layer 904 located vertically above the gate electrode pattern 904. Upon annealing at an elevated temperature, nickel-induced lateral crystallization causes to grow crystalline silicon laterally between the nickel patterns 914. As described above the Si layers 908, 910, 912 are crystallized by nickel-induced crystallization. The Si layers 910, 912 are etched off leaving the crystallized first intrinsic Si layer 908. Alternatively, the second intrinsic Si layer 912 can be omitted, and the nickel patterns 914 can be formed directly over the first doped layer 910. In this case, after crystallization, the first doped layer 910 is removed, leaving the crystallized first intrinsic Si layer 908. Also, a barrier layer under the nickel patterns can be used to reduce the nickel incorporation in the silicon layers.

FIG. 9B shows a TFT device 920 fabricated with the crystallized first intrinsic layer 908. Source-drain regions 922 are formed by incorporating either n-type dopant or p-type dopant in the selected portions of the first intrinsic Si layer 908 in order to form either n-channel or TFTs or p-channel TFTs, respectively. In the case of forming n-channel devices, instead of doping selected portions of the first intrinsic Si layer 908, the n-type source-drain regions can be formed by etching the first doped Si layer 910 only from above the channel, while leaving it in source-drain regions 922. The remaining first doped Si layer 910 becomes the source-drain regions 922 in this case.

As discussed previously, during TFT fabrication process flow from FIG. 9A to FIG. 9B, the first doped Si layer 910 is etched off from above the first intrinsic Si layer 908 (either entirely, or from above the channel portion while leaving the first doped Si layer 910 on the source-drain portions of the first intrinsic Si layer 908). During the etching process, the top part of the first intrinsic Si layer 908 is also etched, since exact end-point for complete removal of the first doped Si layer 910 cannot be accurately controlled and thus there is a need to do an over-etching to make sure that first doped layer 910 is not left where it is not desired.

Figure 9C:
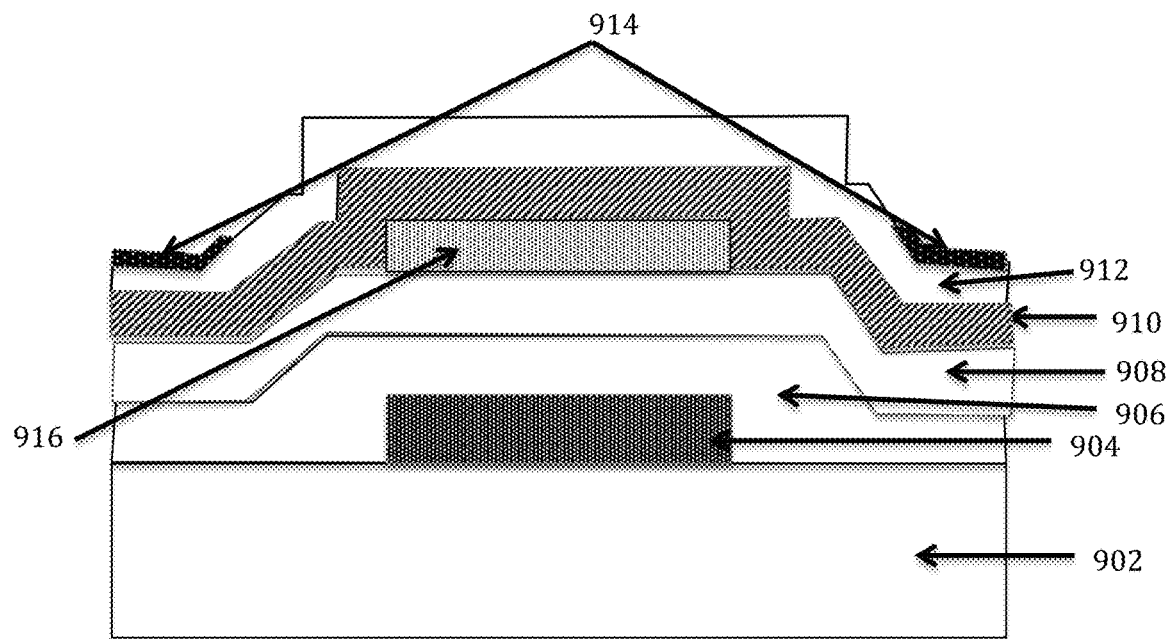
FIGS. 9C and 9D show schematic diagrams of a method for forming a bottom-gate polycrystalline silicon thin film transistor incorporating an etch-stop pattern aided by a metal catalyst, according to an embodiment of the present invention.
Figure 9D:
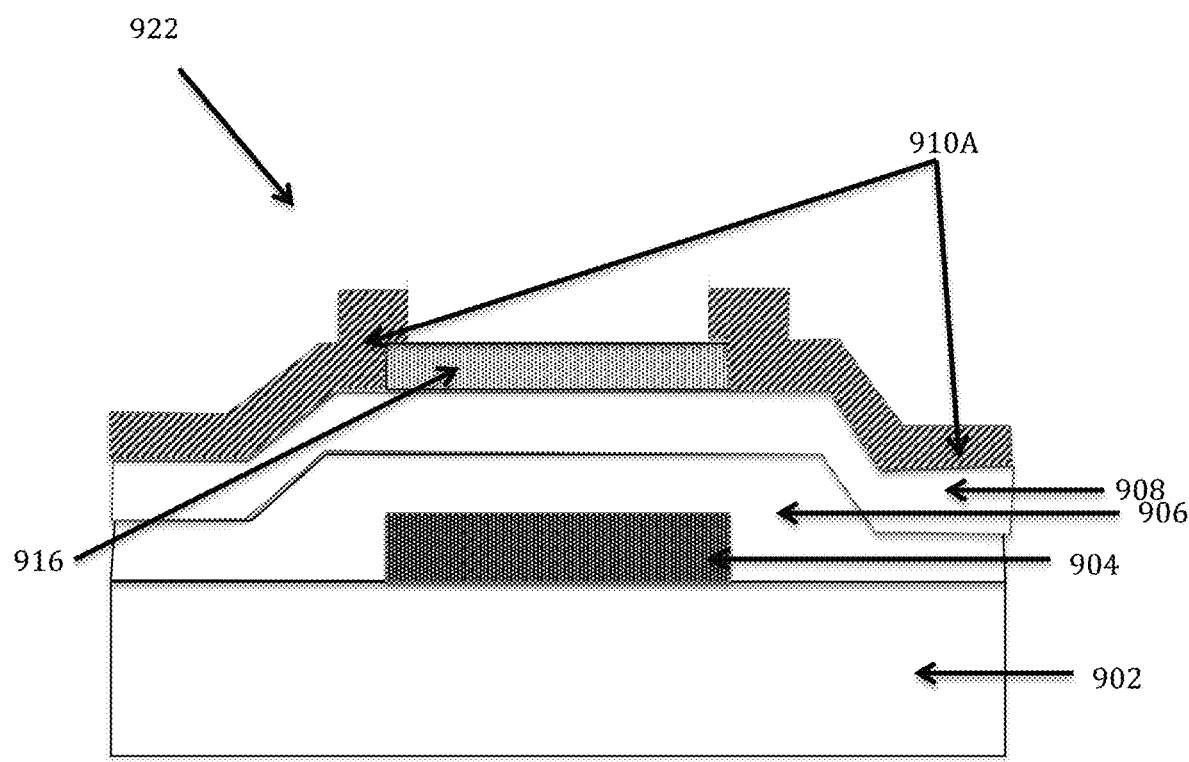

This etching process also can cause plasma damage to the channel region. In order to protect the channel layer from any etching damage, an etch-stop pattern can be formed above the channel portion of the first intrinsic Si layer 908 prior to the formation of the first doped silicon layer 910. FIGS. 9C-9D show a fabrication process for incorporating the etch-stop pattern in a TFT structure. FIG. 9C is similar to FIG. 9A, but has an additional etch-stop pattern 916 above the channel area of the intrinsic silicon film 908. Thus, the first doped Si layer 910 is not continuously formed over the entire first intrinsic Si film 908, but partly over the etch-stop pattern 916 and the rest over the Si layer 908. The etch-stop pattern 916 generally can be made from silicon nitride (which is a good barrier to impurity diffusion) but can be made from any other material, such as silicon oxide. The structure shown in FIG. 9C is annealed to facilitate the crystallization of the first intrinsic Si layer 908 by nickel induced lateral crystallization, where upon annealing, the nickel travels vertically down to the first intrinsic Si layer 908 through the second intrinsic Si layer 912 and the first doped Si layer 910. From there, the lateral crystal growth occurs in the first intrinsic Si layer 908, as well as in the second intrinsic Si layer 912 and the first doped Si layer 910, to cause the crystallization in the channel region. After the crystallization, the second intrinsic Si layer 912, if employed, and the first doped Si layer 910 are removed. The first doped Si layer 910 is only etched from above the etch-stop pattern 916, while leaving the first doped Si layer 910 in the source-drain regions. FIG. 9D shows resulting patterns 910A, which can be used as source-drain regions for an n-type TFT 922.

Alternatively, the first doped Si layer 910 can be entirely removed and the areas of the first intrinsic Si layer 908 located under the patterns 910A can either be doped p-type or n-type by implantation to form source-drain regions of either p-channel or n-channel TFTs, respectively. During the implantation, the etch-stop pattern 916 can also be used as implant-mask to mask dopant implantation into the channel region. If the etch-stop pattern 916 is made from silicon nitride or from a material that is a diffusion barrier to nickel, then nickel over the second intrinsic Si layer 912, or over the first doped Si layer 910, if the second intrinsic Si layer 912 is not used, does not have to be in pattern form, but can also be formed as a continuous layer because the etch-stop pattern 916 stops direct vertical diffusion of nickel to the channel area. Nickel can only enter the channel area from either side of the etch-stop pattern 916, which ensures that the lateral crystallization occurs in the channel region.

If the first doped Si layer 910 is selectively etched only from above the etch-stop pattern 916, while leaving the first doped layer 910 in the source-drain areas, as is done for the TFT structure 922 in FIG. 9D, then this selective etching of the first doped Si layer 910, and the second intrinsic Si layer 912 if employed, from above the etch-stop pattern 916 can also be done before the crystallization annealing rather than after crystallization annealing. Similarly for the case of FIG. 9A, where there is no etch-stop pattern, if the first doped Si layer 910 is selectively etched only from above the channel portion of the first intrinsic Si layer 908, while leaving the first doped Si layer 910 in the source-drain area, then selective etching of the first doped Si layer 910, and the second intrinsic Si layer 912 is employed, from above the channel area of the first intrinsic Si layer 908 can be done before crystallization annealing rather than after crystallization annealing. Accordingly, the first doped Si layer 910, and the second intrinsic Si layer 912 if employed, do not have to be continuous over the entire first intrinsic Si layer 908, but the first doped Si layer 910 has to be at least present under the nickel patterns during crystallization annealing to make sure nickel is gettered while the crystallization annealing travels vertically.

What is claimed is:

1. A method of producing a reduced-defect density crystalline silicon film, comprising:
    forming a first silicon film on a substrate, the first silicon film being amorphous at formation;
    forming a $Si_xGe_{1-x}$ film on the first silicon film, x having a value between zero and one including zero, the $Si_xGe_{1-x}$ film being amorphous at formation, the $Si_xGe_{1-x}$ film being spaced apart from the substrate by the first amorphous silicon film;
    forming a second silicon film on the $Si_xGe_{1-x}$ film, the second silicon film being intrinsic, the second silicon film being amorphous at formation; and
    annealing to cause crystallization of the $Si_xGe_{1-x}$ film, the second silicon film, and the first silicon film, such that the crystallization is initiated within the $Si_xGe_{1-x}$ film and propagates through the first silicon film and the second silicon film, transforming the second silicon film to a reduced-density, intrinsic, crystallized, second silicon film.

2. The method of claim 1, wherein the $Si_xGe_{1-x}$ film is doped.

3. The method of claim 1 further comprising forming a doped silicon film between the $Si_xGe_{1-x}$ film and the second silicon film, wherein the doped silicon film is amorphous at formation, wherein the annealing is performed to cause the crystallization of the $Si_xGe_{1-x}$ film, the doped silicon film, the first silicon film, and the second silicon film, such that the crystallization is initiated within the $Si_xGe_{1-x}$ film, and the crystallization propagates through the doped silicon film, the second silicon film, and the first silicon film.

4. The method of claim 1 wherein the annealing temperature is 600 degrees Celsius or lower.

5. The method of claim 1, wherein the first silicon film has thickness in the range of 500-1500 angstroms, and the $Si_xGe_{1-x}$ film has a thickness in the range of 500-1000 angstroms.

6. The method of claim 1, wherein the annealing has a thermal budget lower than a thermal budget required to crystallize the first silicon film and the second silicon film without the presence of the $Si_xGe_{1-x}$ film between the first silicon film and the second silicon film.

7. A method of forming a thin film transistor, comprising:
    forming a first silicon layer on a substrate, the first silicon layer being amorphous at formation;
    forming a $Si_xGe_{1-x}$ layer on the first silicon layer, x having a value between zero and one including zero, the $Si_xGe_{1-x}$ layer being amorphous at formation, the $Si_xGe_{1-x}$ layer being spaced apart from the substrate by the first silicon layer;
    forming a second silicon layer on the $Si_xGe_{1-x}$ layer, the second silicon layer being amorphous at formation, the second silicon layer including intrinsic silicon;
    annealing to cause crystallization of the $Si_xGe_{1-x}$ layer, the second silicon layer, and the first silicon layer, such that the crystallization is initiated within the $Si_xGe_{1-x}$ layer and propagates through the first silicon layer and the second silicon layer;
    doping the second silicon layer in selected areas to form source and drain regions separated by a channel portion;
    forming a gate insulator layer on the second silicon layer; and
    forming a gate electrode pattern over the gate insulator layer.

8. The method of claim 7, where the $Si_xGe_{1-x}$ layer is a doped layer having a conductivity type opposite of that of source-drain regions.

9. The method of claim 7 further comprising forming a doped silicon layer between the $Si_xGe_{1-x}$ layer and the second silicon layer, the doped silicon layer being amorphous at formation, the conductivity type of the doped silicon layer being of opposite type of that of source-drain regions, wherein the annealing is performed to cause the crystallization of the $Si_xGe_{1-x}$ layer, the doped silicon layer, the second silicon layer, and the first silicon layer, such that the crystallization is initiated within the $Si_xGe_{1-x}$ layer, and the crystallization propagates through the doped silicon layer, the second silicon layer, and the first silicon layer.

10. The method of claim 7 where the annealing temperature is 600 degrees Celsius or lower.

11. The method of claim 7, wherein the first silicon layer has thickness is in the range of 500-1500 angstrom, the $Si_xGe_{1-x}$ layer has a thickness in the range of 500-1000 angstrom, and the second silicon layer has thickness in the range of 200-1000 angstrom.

12. The method of claim 7, wherein the doping of the second silicon layer to form source-drain regions is performed by one or more doping steps selected from a group of doping steps comprising doping before formation of the gate insulator layer, doping after formation of the gate insulator layer, and doping after formation of the gate electrode pattern.

13. The method of claim 7, wherein the annealing has a thermal budget lower than a thermal budget required to crystallize the first silicon layer and the second silicon layer without the presence of the $Si_xGe_{1-x}$ layer between the first silicon layer and the second silicon layer.

* * * * *